United States Patent
Li et al.

(10) Patent No.: US 12,313,933 B2
(45) Date of Patent: May 27, 2025

(54) BACKPLANE AND METHOD FOR MANUFACTURING THE SAME, AND DISPLAY DEVICE

(71) Applicants: BOE MLED Technology Co., Ltd., Beijing (CN); BOE TECHNOLOGY GROUP CO., LTD., Beijing (CN)

(72) Inventors: Pei Li, Beijing (CN); Haiwei Sun, Beijing (CN); Ming Zhai, Beijing (CN); Lu Yu, Beijing (CN); Kangle Chang, Beijing (CN); Jinpeng Li, Beijing (CN); Pengjun Cao, Beijing (CN); Yutao Hao, Beijing (CN); Shubai Zhang, Beijing (CN); Shuo Wang, Beijing (CN); Pei Qin, Beijing (CN); Zewen Gao, Beijing (CN); Yali Zhang, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/601,499

(22) Filed: Mar. 11, 2024

(65) Prior Publication Data
US 2024/0210754 A1    Jun. 27, 2024

Related U.S. Application Data

(63) Continuation of application No. 17/626,154, filed as application No. PCT/CN2021/075601 on Feb. 5, 2021, now Pat. No. 11,960,167.

(30) Foreign Application Priority Data

Feb. 17, 2020 (CN) .......................... 202010097212.1

(51) Int. Cl.
G02F 1/13357    (2006.01)
H01L 25/16    (2023.01)
(Continued)

(52) U.S. Cl.
CPC ...... *G02F 1/133603* (2013.01); *H01L 25/167* (2013.01); *H10H 20/853* (2025.01);
(Continued)

(58) Field of Classification Search
None
See application file for complete search history.

(56) References Cited

U.S. PATENT DOCUMENTS 9,293,476 B2    3/2016    Bedell et al.
9,755,110 B1    9/2017    Crowder et al.
(Continued)

FOREIGN PATENT DOCUMENTS

CN    101051634 A    10/2007
CN    101246879 A    8/2008
(Continued)

OTHER PUBLICATIONS

Chinese Office Action (w/ English translation) for corresponding Application No. 202010097212.1, dated Jun. 26, 2024, 16 pages.
(Continued)

*Primary Examiner* — Phu Vu
(74) *Attorney, Agent, or Firm* — Dority & Manning, P.A.

(57) ABSTRACT

A backplane includes: a substrate including a circuit structure layer and a second reflective layer, a first reflective layer disposed on a bearing surface of the substrate, a plurality of light-emitting diode chips, and a plurality of optical structures. The first reflective layer includes a plurality of through holes spaced apart. A light-emitting diode chip in the plurality of light-emitting diode chips is located in a through hole. The plurality of light-emitting diode chips are electri-
(Continued)

cally connected to the circuit structure layer. The circuit structure layer is configured to drive the plurality of light-emitting diode chips to emit light. An optical structure in the plurality of optical structures covers the light-emitting diode chip, a light incident surface of the optical structure is in contact with a light exit surface of the light-emitting diode chip, and a light exit surface of the optical structure is a curved surface.

20 Claims, 16 Drawing Sheets

(51) Int. Cl.
  H10H 20/01      (2025.01)
  H10H 20/851     (2025.01)
  H10H 20/853     (2025.01)
  H10H 20/854     (2025.01)
  H10H 20/856     (2025.01)
(52) U.S. Cl.
  CPC . H10H 20/856 (2025.01); H01L 2224/13139 (2013.01); H10H 20/0361 (2025.01); H10H 20/8514 (2025.01); H10H 20/854 (2025.01)

(56)  References Cited

U.S. PATENT DOCUMENTS

| | | | |
|---|---|---|---|
| 10,446,634 | B2 | 10/2019 | Qian et al. |
| 11,960,167 | B2 * | 4/2024 | Li .................. H01L 33/60 |
| 2006/0094143 | A1 | 5/2006 | Haluzak et al. |
| 2006/0157724 | A1 | 7/2006 | Fujita |
| 2007/0029554 | A1 | 2/2007 | Nakamura et al. |
| 2009/0065789 | A1 | 3/2009 | Wang et al. |
| 2011/0090689 | A1 | 4/2011 | Park |
| 2012/0120325 | A1 | 5/2012 | Shimizu |
| 2012/0243261 | A1 | 9/2012 | Yamamoto et al. |
| 2013/0015478 | A1 | 1/2013 | Oh et al. |
| 2014/0209945 | A1 | 7/2014 | Baldridge et al. |
| 2014/0367633 | A1 | 12/2014 | Bibl et al. |
| 2015/0179703 | A1 | 6/2015 | Sakariya et al. |
| 2016/0043061 | A1 | 2/2016 | Rhee |
| 2016/0131329 | A1 | 5/2016 | Park et al. |
| 2016/0252218 | A1 | 9/2016 | Fujikawa et al. |
| 2016/0252231 | A1 | 9/2016 | Fujikawa et al. |
| 2016/0336374 | A1 | 11/2016 | Jiang et al. |
| 2016/0351092 | A1 | 12/2016 | Chen et al. |
| 2017/0025399 | A1 | 1/2017 | Takeya et al. |
| 2017/0062514 | A1 | 3/2017 | Park |
| 2017/0125647 | A1 | 5/2017 | Park et al. |
| 2018/0082984 | A1 | 3/2018 | Qin |
| 2018/0190615 | A1 | 7/2018 | Pan |
| 2018/0315775 | A1 | 11/2018 | He et al. |
| 2018/0358340 | A1 | 12/2018 | Wong et al. |
| 2019/0101793 | A1 | 4/2019 | Takase |
| 2019/0181184 | A1 | 6/2019 | Hu et al. |
| 2020/0142259 | A1 | 5/2020 | Liu et al. |
| 2020/0152693 | A1 | 5/2020 | Zou et al. |
| 2020/0294975 | A1 | 9/2020 | Xuan et al. |
| 2021/0225823 | A1 | 7/2021 | Liang et al. |
| 2021/0264852 | A1 | 8/2021 | Gu et al. |
| 2022/0199865 | A1 | 6/2022 | Dong et al. |

FOREIGN PATENT DOCUMENTS

| | | | |
|---|---|---|---|
| CN | 101866910 | A | 10/2010 |
| CN | 102054920 | A | 5/2011 |
| CN | 103515511 | A | 1/2014 |
| CN | 103545438 | A | 1/2014 |
| CN | 103747597 | A | 4/2014 |
| CN | 104112755 | A | 10/2014 |
| CN | 104282708 | A | 1/2015 |
| CN | 105742307 | A | 7/2016 |
| CN | 205944093 | U | 2/2017 |
| CN | 107195654 | A | 9/2017 |
| CN | 108133910 | A | 6/2018 |
| CN | 109410775 | A | 3/2019 |
| CN | 110416242 | A | 11/2019 |
| CN | 110543049 | A | 12/2019 |
| CN | 111028697 | A | 4/2020 |
| JP | 2003150075 | A | 5/2003 |
| WO | WO 2015/175131 | A1 | 11/2015 |
| WO | WO 2017/066604 | A1 | 4/2017 |
| WO | WO 2019/227618 | A1 | 12/2019 |

OTHER PUBLICATIONS

First Office Action (with English translation) for corresponding Chinese Application No. 201610695442.1, dated Mar. 5, 2018, 15 pages.
First Office Action (with English translation) for corresponding Chinese Application No. 202010106988.5, dated Mar. 23, 2022, 14 pages.
Second Office Action (with English translation) for corresponding Chinese Application No. 201610695442.1, dated Nov. 20, 2018, 19 pages.
European Office Action for corresponding European Application No. 17841064.3, dated Dec. 14, 2021, 6 pages.
Extended European Search Report for corresponding European Application No. 17841064.3, dated Feb. 6, 2020, 8 pages.
PCT International Search Report and Written Opinion (with English translations) for corresponding PCT Application No. PCT/CN2021/075601, mailed Apr. 30, 2021, 16 pages.
PCT International Search Report and Written Opinion (with English translations) for corresponding PCT Application No. PCT/CN2017/097634, mailed Nov. 16, 2017, 22 pages.
PCT International Search Report and Written Opinion (with English translations) for corresponding PCT Application No. PCT/CN2019/117510, mailed on Aug. 13, 2020, 14 pages.
PCT International Search Report and Written Opinion (with English translations) for corresponding PCT Application No. PCT/CN2021/070170, mailed on Apr. 16, 2021, 15 pages.
Final Office Action for corresponding U.S. Appl. No. 15/772,304, dated Oct. 22, 2019, 11 pages.
Non-Final Office Action for corresponding U.S. Appl. No. 15/772,304, dated Jun. 3, 2019, 10 pages.
Notice of Allowance for corresponding U.S. Appl. No. 15/772,304, dated Mar. 6, 2020, 8 pages.
Office Action (Restriction Requirement) for corresponding U.S. Appl. No. 15/772,304, dated Feb. 8, 2019, 6 pages.
Decision of Rejection (with English translation) for corresponding Application No. 202010106988.5, dated Sep. 30, 2022, 13 pages.
First Office Action (with English translation) for corresponding Chinese Application No. 201980002397.9, dated Oct. 18, 2022, 20 pages.
Second Office Action (with English translation) for corresponding Chinese Application No. 201980002397.9, dated Jul. 7, 2023, 12 pages.
Office Action (Advisory Action) for corresponding U.S. Appl. No. 17/041,844, dated Dec. 22, 2023, 3 pages.
Office Action (Advisory Action) for corresponding U.S. Appl. No. 17/041,844, dated Jan. 23, 2024, 3 pages.
Final Office Action for corresponding U.S. Appl. No. 17/041,844, dated Oct. 5, 2023, 13 pages.
Non-Final Office Action for corresponding U.S. Appl. No. 17/041,844, dated Apr. 25, 2023, 11 pages.
Non-Final Office Action for corresponding U.S. Appl. No. 17/041,844, dated Feb. 26, 2024, 10 pages.
Corrected Notice of Allowability for corresponding U.S. Appl. No. 17/626,154, dated Dec. 21, 2023, 5 pages.
Non-Final Office Action for corresponding U.S. Appl. No. 17/626,154, dated Aug. 31, 2023, 15 pages.
Notice Of Allowance for corresponding U.S. Appl. No. 17/626,154, dated Dec. 13, 2023, 8 pages.

* cited by examiner ial application is a continuation of U.S. patent application Ser. No. 17/626,154, filed on Jan. 11, 2022, which claims priority to International Patent Application No. PCT/CN2021/075601, filed on Feb. 5, 2021, which claims priority to Chinese Patent Application No. 202010097212.1, filed on Feb. 17, 2020, which are incorporated herein by reference in their entirety.

BACKPLANE AND METHOD FOR MANUFACTURING THE SAME, AND DISPLAY DEVICE

CROSS-REFERENCE TO RELATED APPLICATIONS

This application is a continuation of U.S. patent application Ser. No. 17/626,154, filed on Jan. 11, 2022, which claims priority to International Patent Application No. PCT/CN2021/075601, filed on Feb. 5, 2021, which claims priority to Chinese Patent Application No. 202010097212.1, filed on Feb. 17, 2020, which are incorporated herein by reference in their entirety.

TECHNICAL FIELD

The present disclosure relates to the field of display technologies, and in particular, to a backplane and a method for manufacturing the same, and a display device.

BACKGROUND

As a self-luminous light-emitting device, mini light-emitting diode (Mini LED) or micro light-emitting diode (Micro LED) may not only be used as a backlight in a passive display device such as a liquid crystal display (LCD) device, but may also be directly used as a pixel unit in a display panel for display. Due to the stable performance of light-emitting diodes and the low cost and long service life of liquid crystal display panels, the scenarios where light-emitting diodes are applied to liquid crystal display devices are becoming more and more diversified.

SUMMARY

In one aspect, a backplane is provided. The backplane includes a substrate, a first reflective layer, a plurality of light-emitting diode chips and a plurality of optical structures. The substrate includes a circuit structure layer and a second reflective layer. The first reflective layer is disposed on a bearing surface of the substrate. The first reflective layer includes a plurality of through holes spaced apart. A light-emitting diode chip in the plurality of light-emitting diode chips is located in one of the plurality of through holes. The plurality of light-emitting diode chips are electrically connected to the circuit structure layer. The circuit structure layer is configured to drive the plurality of light-emitting diode chips to emit light. An optical structure in the plurality of optical structures covers the light-emitting diode chip in the plurality of light-emitting diode chips. A light incident surface of the optical structure is in contact with a light exit surface of the light-emitting diode chip. A light exit surface of the optical structure is a curved surface. The first reflective layer, the second reflective layer and the circuit structure layer are disposed in respective different layers; and the second reflective layer and the circuit structure layer are located on a same side of the first reflective layer.

In some embodiments, the light exit surface of the optical structure is a convex surface that protrudes toward a side of the light-emitting diode chip away from the substrate.

In some embodiments, an orthogonal projection of the optical structure on the substrate overlaps with an orthogonal projection of a wall of the through hole on the substrate.

In some embodiments, the optical structure has a bottom surface relative to the light incident surface; and the optical structure is in contact with a wall of the through hole, a region of the optical structure in contact with the wall of the through hole has a protruding portion, and a distance exists between the protruding portion and the bottom surface.

In some embodiments, the through hole includes a first sub-through hole and a second sub-through hole disposed on a side, away from the substrate, of the first sub-through hole. A diameter of the first sub-through hole is smaller than a diameter of the second sub-through hole. The optical structure is in contact with at least a wall of the first sub-through hole.

In some embodiments, an orthogonal projection of the wall of the first sub-through hole on the substrate is located within an orthogonal projection of a wall of the second sub-through hole on the substrate.

In some embodiments, the optical structure is further in contact with a wall of the second sub-through hole.

In some embodiments, the first reflective layer includes a first reflective sub-layer and a second reflective sub-layer; the first sub-through hole is disposed in the first reflective sub-layer, and the second sub-through hole is disposed in the second reflective sub-layer.

In some embodiments, the first reflective layer is an ink structure layer. Or, the first reflective layer is a white reflective sheet, and the white reflective sheet includes a plurality of micro air bubbles.

In some embodiments, the first reflective layer is in contact with the second reflective layer; and the first reflective layer and the second reflective layer are made of a same material.

In some embodiments, a first maximum distance exists between a surface of the light-emitting diode chip away from the bearing surface of the substrate and the bearing surface of the substrate. A second maximum distance exists between a surface of the first reflective layer away from the bearing surface of the substrate and the bearing surface of the substrate. The first maximum distance is greater than the second maximum distance; or, the first maximum distance is less than the second maximum distance.

In some embodiments, a wall of the through hole has a protruding step, the through hole has an opening away from the substrate, and an orthogonal projection of the protruding step on the substrate is located within an orthogonal projection of the opening of the through hole on the substrate; and a third maximum distance exists between the protruding step and the bearing surface of the substrate, and a fourth maximum distance exists between the light exit surface of the optical structure and the bearing surface of the substrate. The fourth maximum distance is greater than the third maximum distance.

In some embodiments, the second reflective layer is located on a side of the circuit structure layer proximate to the first reflective layer; the second reflective layer includes a plurality of hollow-out portions; the circuit structure layer includes a plurality of pads; a hollow-out portion in the plurality of hollow-out portions exposes at least one of the plurality of pads; and a single light-emitting diode chip is electrically connected to two of the plurality of pads. Or, the second reflective layer is located on a side of the circuit structure layer away from the first reflective layer; the circuit structure layer has a plurality of metal wiring regions and a plurality of light-transmitting regions, a light-transmitting region being located between two adjacent metal trace regions; the circuit structure layer includes a plurality of pads; a metal wiring region is provided with pads therein; a single light-emitting diode chip is electrically connected to two of the pads in the metal wiring region; and the light-transmitting region is configured to transmit a portion of light emitted by the light-emitting diode chip and reflected by the second reflective layer.

In some embodiments, a gap exists between a wall of the through hole and the light-emitting diode chip. An orthogonal projection, on the circuit structure layer, of the gap overlaps with an orthogonal projection, on the circuit structure layer, of a portion of a surface of the second reflective layer proximate to the first reflective layer.

In some embodiments, the second reflective layer includes a first transparent insulating sub-layer, a metal reflective layer and a second transparent insulating sub-layer that are stacked in sequence in a thickness direction of the substrate.

In some embodiments, the backplane further includes an adhesive layer. The adhesive layer is located between the first reflective layer and the substrate, and is configured to bond the first reflective layer to the substrate.

In some embodiments, the backplane further includes a hydrophobic layer. The hydrophobic layer is disposed on a side of the first reflective layer away from the substrate. The hydrophobic layer includes a plurality of openings. An orthogonal projection, on the substrate, of a through hole in the plurality of through holes is located within an orthogonal projection, on the substrate, of an opening in the plurality of openings.

In some embodiments, materials of the optical structure include a transparent colloidal material and a fumed silica material.

In some embodiments, materials of the optical structure include a transparent colloidal material and a light conversion material mixed in the transparent colloidal material; and the light conversion material is configured to convert a color of light emitted by the light-emitting diode chip. And/or, the backplane further includes a light conversion layer, and the light conversion layer is located on a surface of the optical structures away from the substrate.

In another aspect, a display device is provided. The display device includes the backplane as described in any of the above embodiments. The backplane is a display substrate; or, the backplane is a backlight module, and the display device further includes a liquid crystal display panel located on a light exit side of the backlight module.

In still another aspect, a method for manufacturing a backplane is provided. The method includes the following steps: providing a substrate, the substrate including a circuit structure layer; forming a first reflective layer and a plurality of light-emitting diode chips on the substrate, the first reflective layer including a plurality of through holes spaced apart, a light-emitting diode chip in the plurality of light-emitting diode chips being located in one of the plurality of through holes, the plurality of light-emitting diode chips being electrically connected to the circuit structure layer, and the circuit structure layer being configured to drive the plurality of light-emitting diode chips to emit light; and, forming a plurality of optical structures on the substrate on which the plurality of light-emitting diode chips have been formed through a dispensing process, an optical structure in the plurality of optical structures covering the light-emitting diode chip in the plurality of light-emitting diode chips, a light incident surface of the optical structure being in contact with a light exit surface of the light-emitting diode chip, and a light exit surface of the optical structure being a curved surface. The method further includes forming a second reflective layer on the circuit structure layer, in which the first reflective layer, the second reflective layer and the circuit structure layer are disposed in respective different layers, and the second reflective layer and the circuit structure layer are located on a same side of the first reflective layer.

In some embodiments, the circuit structure layer includes a plurality of pads. Forming the first reflective layer and the plurality of light-emitting diode chips on the substrate includes: forming a first ink film on a bearing surface of the substrate, and forming a plurality of through holes in the first ink film, so as to form the first reflective layer; and forming the plurality of light-emitting diode chips on the substrate on which the first reflective layer has been formed, each light-emitting diode being electrically connected to two of the plurality of pads.

In some embodiments, forming the first ink film on the bearing surface of the substrate, and forming the plurality of through holes in the first ink film, so as to form the first reflective layer includes: forming a first ink sub-film on the bearing surface of the substrate, and forming first sub-through holes in the first ink sub-film; and forming a second ink sub-film on the first ink sub-film, and forming second sub-through holes in the second ink sub-film, a first sub-through hole and a corresponding second sub-through hole being communicated with each other to form a through hole, so as to form the first reflective layer.

In some embodiments, the circuit structure layer includes a plurality of pads. Forming the first reflective layer and the plurality of light-emitting diode chips on the substrate includes: forming the plurality of light-emitting diode chips on the substrate, a light-emitting diode chip in the plurality of light-emitting diode chips being electrically connected to two of the plurality of pads; providing a reflective sheet, forming an adhesive film on a non-functional surface of the reflective sheet, and attaching a first protective film onto the adhesive film; forming a plurality of through holes in the reflective sheet, the adhesive film and the first protective film, each through hole penetrating the reflective sheet, the adhesive film and the first protective film, so as to obtain the first reflective layer, an adhesive layer and a first protective layer; and tearing off the first protective layer, and attaching the first reflective layer to a bearing surface of the substrate through the adhesive layer, so that the plurality of light-emitting diode chips are located in the plurality of through holes in one-to-one correspondence.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1A:
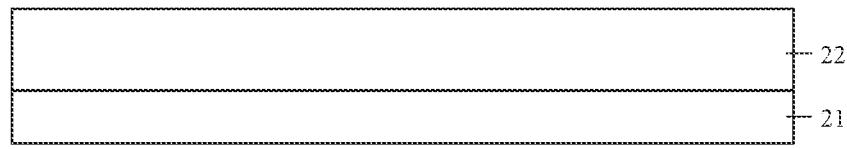
FIG. 1A is a structural diagram of a liquid crystal display device, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" as used herein indicates an open and inclusive expression, which does not exclude devices that are applicable to or configured to perform additional tasks or steps.

The term "about" or "approximately" as used herein includes a stated value and an average value within an acceptable range of deviation of a particular value. The acceptable range of deviation is determined by a person of ordinary skill in the art in view of the measurement in question and errors associated with the measurement of a particular amount (i.e., the limitations of the measurement system).

Exemplary embodiments are described herein with reference to cross-sectional views and/or plan views as idealized exemplary drawings. In the accompanying drawings, thicknesses of layers and sizes of regions are enlarged for clarity. Variations in shape with respect to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of the region in a device, and are not intended to limit the scope of the exemplary embodiments.

Figure 1B:
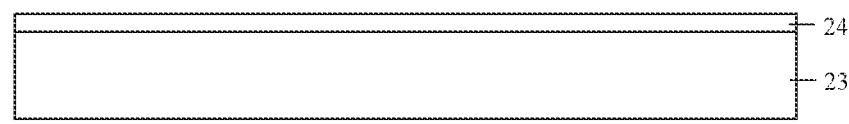
FIG. 1B is a structural diagram of an electroluminescence display device or a photoluminescence display device, in accordance with some embodiments.

With reference to FIGS. 1A and 1B, some embodiments of the present disclosure provide a display device 200. The display device 200 may be a liquid crystal display (LCD) device. The display device 200 may also be an electroluminescent display device or a photoluminescent display device. In a case where the display device 200 is the electroluminescent display device, the electroluminescent display device may be an organic light-emitting diode (OLED) display device or a quantum dot light-emitting diode (QLED) display device. In a case where the display device 200 is the photoluminescent display device, the photoluminescent display device may be a quantum dot photoluminescent display device.

In a case where the display device 200 is the liquid crystal display device 201, as shown in FIG. 1A, the liquid crystal display device 201 may include a backlight module 21 and a liquid crystal display panel 22. The backlight module 21 may provide a light source for the liquid crystal display panel 22.

In a case where the display device 200 is the electroluminescent display device 202 (or the photoluminescent display device), as shown in FIG. 1B, the electroluminescent display device 202 (or the photoluminescent display device) may include a display substrate 23 (for example, an electroluminescent display substrate or a photoluminescent display substrate) and an encapsulation layer 24.

Figure 2A:
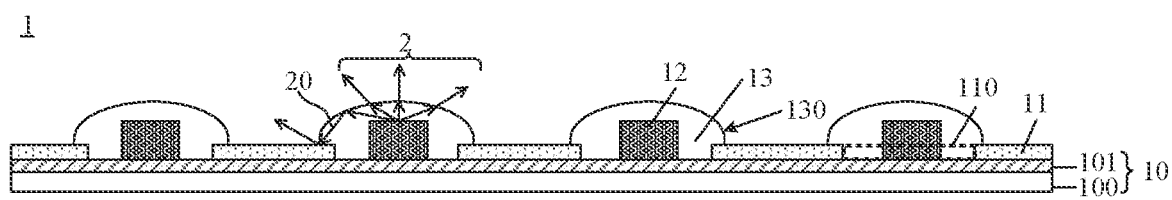
FIG. 2A is a structural diagram of a backplane, in accordance with some embodiments.

As shown in FIG. 2A, some embodiments of the present disclosure provide a backplane 1. The backplane 1 includes a substrate 10, a first reflective layer 11, a plurality of light-emitting diode (LED) chips 12 and a plurality of optical structures 13. It will be noted that, the backplane 1 may be used as the backlight module or the display substrate in the display device mentioned above.

The substrate 10 includes a circuit structure layer 101. The substrate 10 may further include a base 100 for carrying the circuit structure layer 101. The base 100 may be made of a flexible material, such as polyimide (PI); the base 100 may also be made of a rigid material, such as glass or silicon; or, the base 100 may be a printed circuit board (PCB); and details will not be limited in the present disclosure.

The first reflective layer 11 is disposed on a bearing surface of the substrate 10. The bearing surface of the substrate 10 is a functional surface of the substrate 10, or may also be understood as a front surface of the substrate 10. In some examples, a surface of the circuit structure layer 101 away from the base 100 is the functional surface of the substrate 10. The first reflective layer 11 includes a plurality of through holes 110 that are spaced apart. The first reflective layer 11 is used to reflect light (for example, a portion of total reflection light 20 in light 2 shown in FIG. 2A) incident onto a surface of the first reflective layer 11. The through holes 110 are used for accommodating the light-emitting diode chips 12. Therefore, a shape and size of the through hole 110 need to be determined according to a shape and size of the light-emitting diode chip 12.

In some embodiments of the present disclosure, a top view of the through hole 110 may be in the shape of, for example, a circle, a rectangle, a square, or any other regular shape. Or, the top view of the through hole 110 may also have an irregular shape. The present disclosure does not limit this.

In some embodiments of the present disclosure, the first reflective layer 11 may be made of an organic or inorganic reflective material with photosensitive and thermal curing properties. A reflectivity of the first reflective layer 11 may be, for example, in a range of approximately 70% to approximately 99%. For example, the reflectivity of the first reflective layer 11 may be 70%, 80% or 99%.

In some embodiments of the present disclosure, the first reflective layer 11 is an ink structure layer. The ink structure layer may be made of white ink. A reflectivity of the white ink to the light 2 is approximately 90%. In this way, an amount of light reflected by the first reflective layer 11 may be increased, and a better light utilization effect may be achieved.

Figure 2B:
FIG. 2B is a structural diagram of a white reflective sheet, in accordance with some embodiments.

Or, as shown in FIG. 2B, the first reflective layer 11 may also be a white reflective sheet 11A. The white reflective sheet 11A may be adhered to the bearing surface of the substrate 10. A reflectivity of the white reflective sheet 11A to the light 2 is approximately 98%. In this way, most of the light 2 reaching the first reflective layer 11 may be reflected to a greatest extent, which increases an amount of light exiting from the backplane 1, and thus improves a display effect of the display device 200.

In some embodiments of the present disclosure, with continued reference to FIG. 2B, the white reflective sheet 11A includes a plurality of micro air bubbles 110A. A diameter of each micro air bubble 110A is, for example, in a range of approximately 1 μm to approximately 5 μm.

In this way, after the through holes are formed in the white reflective sheet 11A with the micro air bubbles 110A, due to the small diameter and high density of the micro air bubbles 110A, the reflectivity of the white reflective sheet 11A is high. Therefore, light that is incident onto walls of the through holes and then enters the white reflective sheet may still exit from the white reflective sheet 11A.

In some embodiments of the present disclosure, a thickness of the first reflective layer 11 is, for example, 50 μm, 100 μm, 150 μm, 180 μm or 300 μm, which may be set according to actual needs.

A light-emitting diode chip in the plurality of light-emitting diode chips 12 is located in one of the plurality of the through-holes 110. The plurality of light-emitting diode chips 12 are all electrically connected to the circuit structure layer 101. The circuit structure layer 101 is configured to provide electrical signals to the plurality of light-emitting diode chips 12, so as to drive the plurality of light-emitting diode chips 12 to emit light.

In some embodiments of the present disclosure, a dimension (such as a length, a width, a diagonal, or a diameter) of a section of the light-emitting diode chip 12 is in a range of approximately 100 μm to approximately 300 μm. A thickness of the light-emitting diode chips 12 is, for example, 100 μm.

Figure 2C:
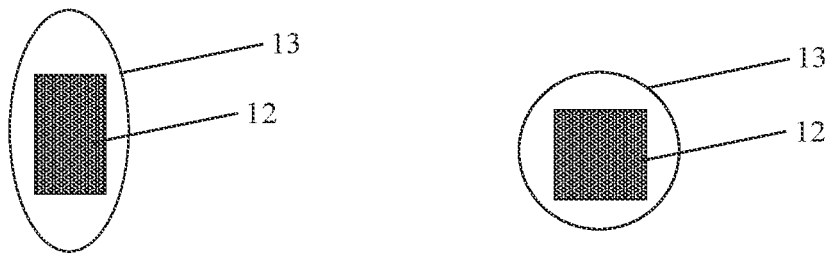
FIG. 2C shows top views of two arrangements showing a relationship between an optical structure and a light-emitting diode chip, in accordance with some embodiments.

In some embodiments of the present disclosure, as shown in FIG. 2C, in a case where a top view of the light-emitting diode chip 12 is in the shape of a rectangle, a section of the through hole 110 is in the shape of, for example, an ellipse. For example, a long axis of the ellipse is parallel to a long side of the rectangle, a short axis of the ellipse is parallel to a short side of the rectangle, and an intersection of diagonals of the rectangle coincides with an intersection of the long and short axes of the ellipse. In a case where a top view of the light-emitting diode chip 12 is in the shape of a square, a section of the through hole 110 is in the shape of, example, a circle. For example, an intersection of diagonals of the square coincides with a center of the circle.

In the above cases, a shape of the light-emitting diode chip 12 matches with the section of the through hole 110. In this way, a gap between the light-emitting diode chip 12 and the through hole 110 may be relatively small, and thus an amount of light reflected by the first reflective layer 11 may be increased. In addition, since an area of an orthogonal projection of the through hole 110 on the base 10 is relatively large, more light will exit through the through hole 110; therefore, a light extraction efficiency of the light-emitting diode chip 12 may be improved.

Figure 2D:
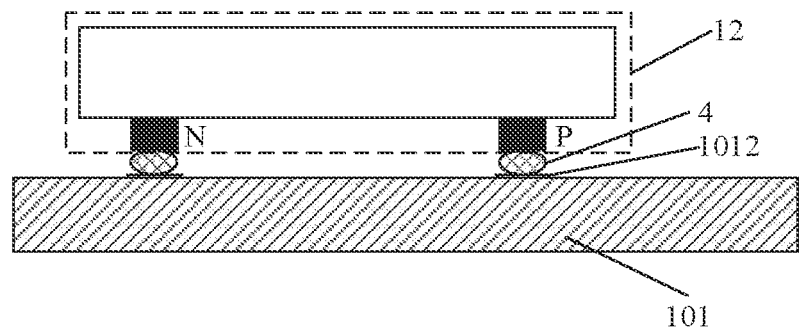
FIG. 2D is a diagram showing a connection relationship between a light-emitting diode chip and a circuit structure layer, in accordance with some embodiments.

In some embodiments of the present disclosure, as shown in FIG. 2D, the circuit structure layer 101 includes a plurality of pads 1012. Two electrodes of a single light-emitting diode chip 12 are electrically connected to two corresponding pads 1012.

For example, as shown in FIG. 2D, the light-emitting diode chip 12 includes a light-emitting layer, an N electrode and a P electrode. The light-emitting layer of the light-emitting diode chip 12 emits light in all directions (360 degrees, three-dimensional). If the N electrode and the P electrode are made of a non-transparent metal, no light will be emitted from regions, where the N electrode and the P electrode are located, of the light-emitting diode chip 12. In some embodiments of the present disclosure, the N electrode and P electrode of the light-emitting diode chip 12 are bonded to two corresponding pads 1012 in the circuit structure layer 101 through a conductive material 4, such as solder or silver glue. The pad 1012 is, for example, connected to a thin film transistor, a capacitor, or other electrical components in the circuit structure layer, and is used for providing an electrical signal to the light-emitting diode chip 12.

A person skilled in the art will understand that, for convenience of illustration, a rectangle is used to represent the light-emitting diode chip 12 in other drawings of the embodiments of the present disclosure except for FIG. 2D, but the rectangle does not constitute a limitation to a shape, structure, or other configurations of the light-emitting diode chip 12.

A color of the light emitted by the light-emitting diode chip 12 may be any one of three primary colors, or may be white. In some embodiments of the present disclosure, the light-emitting diode chip 12 is an LED chip for emitting blue light.

An optical structure 13 in the plurality of optical structures 13 covers one of the plurality of light-emitting diode chips 12. A light incident surface of the optical structure 13 is in contact with a light exit surface of the light-emitting diode chip 12. Light exit surfaces 130 of the optical structures 13 are curved surfaces.

An orthogonal projection of the optical structure 13 on the substrate 10 overlaps with an orthogonal projection of a wall of the through hole 110 on the substrate 10.

Material(s) of the optical structure 13 include at least a transparent colloid material. The transparent colloid material is, for example, an encapsulating adhesive. The encapsulating adhesive is, for example, at least one of silica gel, epoxy adhesive or acrylic adhesive. The light incident surface of the optical structure 13 is in contact with the light exit surface of the light-emitting diode chip 12. That is, there is no gap between the incident surface of the optical structure 13 and the light exit surface of the light-emitting diode chip 12. A person skilled in the art will understand that, the optical structure 13 made of the encapsulating glue may adhere to the light-emitting diode chip 12 to wrap the light-emitting diode chip 12. In some embodiments of the present disclosure, the optical structure 13 is fabricated through a dispensing process.

In some embodiments of the present disclosure, the light exit surface of the optical structure 13 is a convex surface that protrudes toward a side of the light-emitting diode chip away from the substrate 10. For example, the optical structure 13 may be an optical lens, and the optical lens is, for example, a convex lens. In this case, the optical structure 13 has a function of converging light, which may improve the light extraction efficiency of the light-emitting diode chip 12.

In some embodiments of the present disclosure, a refractivity of the optical structure 13 is in a range of approximately 1.3 to approximately 1.7.

As shown in FIG. 2A, the light exit surface 130 of each optical structure 13 (a surface thereof away from the substrate 10) is a curved surface with a certain curvature. When the light 2 emitted by the light-emitting diode chip 12 is incident onto the light exit surface 130 of the optical structure 13, due to a relatively small incident angle, most of the light 2 will exit normally, while a portion of the light 2 will be totally reflected on the light exit surface 130 of the optical structure 13. The portion of the light 2 that is totally reflected is referred to as the "total reflection light 20". When the total reflection light 20 in the optical structure 13 reaches the first reflective layer 11, the total reflection light 20 will be reflected by the first reflective layer 11, and then exits in directions moving away from the substrate 10.

It will be noted that, a curvature of the "curved surface with a certain curvature" is related to an incident angle of the light emitted by the light-emitting diode chip 12 that is incident onto the optical structure 13. That is, the setting of the curvature is related to the shape and dimensions of the light-emitting diode chip 12; the curvature may be set to any value, as long as it is ensured that only a small portion of the light 2 is totally reflected when the light 2 is incident onto the light exit surface 130, and a large portion of the light 2 exits normally.

Figure 3:
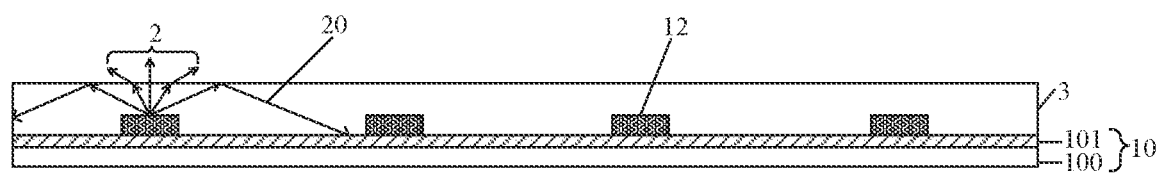
FIG. 3 is a structural diagram of a backplane, in accordance with the related art.

As shown in FIG. 3, in the related art, a backplane 01 includes a substrate 10, light-emitting diode chips 12 electrically connected to a circuit structure layer 101 in the substrate 10, and a protective layer 3. The protective layer 3 may be made of, for example, an encapsulating adhesive. The protective layer 3 covers the light-emitting diode chips 12 as a one-piece whole layer. However, since a light exit surface of the protective layer 3 (a surface thereof away from the substrate 10) is flat, incident angles of a portion of the light 2 emitted by the light-emitting diode chip 12 at the light exit surface of the protective layer 3 are relatively large. The portion of the light 2 with relatively large incident angle(s) will be totally reflected. The portion of the light 2 that is reflected totally is referred to as the "total reflection light 20", i.e., the total reflection light 20 shown in FIG. 3. The total reflection light 20 will propagate in direction(s) toward the substrate 10. Since the total reflection light 20 cannot propagate in direction(s) moving away from the substrate 10, it cannot be utilized, which results in a relative low light extraction efficiency of the light-emitting diode chip 12 and a relatively high power consumption of the backplane 01. In addition, since the protective layer 3 covers the light-emitting diode chips 12 as a one-piece whole layer, a large quantity of the encapsulating adhesive is required, resulting in a high production cost of the backplane 01.

In contrast, in some embodiments of the present disclosure, the backplane 1 is provided with the first reflective layer 11 and the optical structures 13 therein. Since the light exit surface 130 of the optical structure 13 is a curved surface, and the light 2 is not prone to be totally reflected on the curved surface, the amount of the total reflection light 20 is reduced, and the amount of the light 2 exiting normally is increased. Therefore, the light extraction efficiency of the light-emitting diode chip 12 is improved. The total reflection light 20 and a portion of the light 2 propagating toward the substrate 10 will change direction after reaching the first reflective layer 11, and then may propagate in direction(s) moving away from the substrate 10. Thereby, the light extraction efficiency of the light-emitting diode chip 12 may be further improved; and after the light extraction efficiency of the light-emitting diode chip 12 is improved, the power consumption of the backplane 1 may be reduced. Moreover, since there are a plurality of optical structures 13, under a premise that the thickness of the backplane is the same, the backplane 1 provided in the embodiments of the present disclosure requires less encapsulating adhesive as compared with the solution in the related art where the protective layer 13 has a one-piece whole layer structure, which may reduce a quantity of encapsulating adhesive and thus effectively reduce the production cost of the backplane 1. In addition, since the optical structure 13 covers the light-emitting diode chip 12, the light-emitting diode chip 12 may be protected, which may reduce a probability of the LED chip 12 being damaged.

Figure 4A:
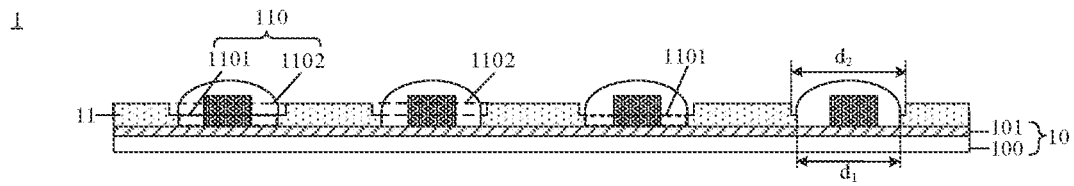
FIG. 4A is a structural diagram of another backplane, in accordance with some embodiments.
Figure 4B:
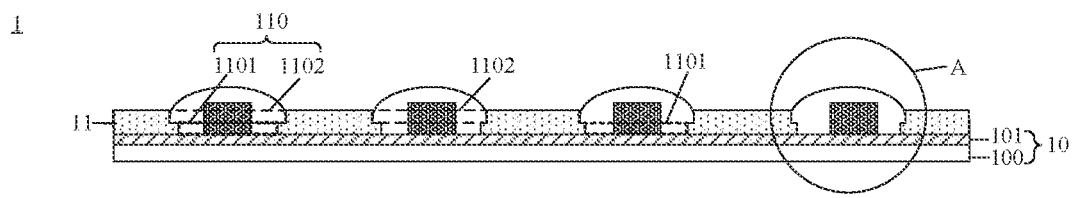
FIG. 4B is a structural diagram of still another backplane, in accordance with some embodiments.
Figure 4C:
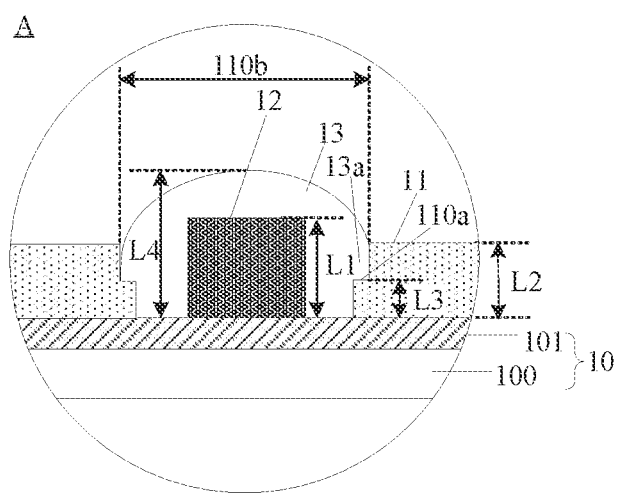
FIG. 4C is an enlarged structural view of the region A shown in FIG. 4B.

As shown in FIG. 4C, the optical structure 13 has a bottom surface relative to the light incident surface. The optical structure 13 is in contact with a wall of the through hole 110, a region of the optical structure 13 in contact with the wall of the through hole 110 has a protruding portion 13a, and a distance exists between the protruding portion 13a and the bottom surface.

Figure 4D:
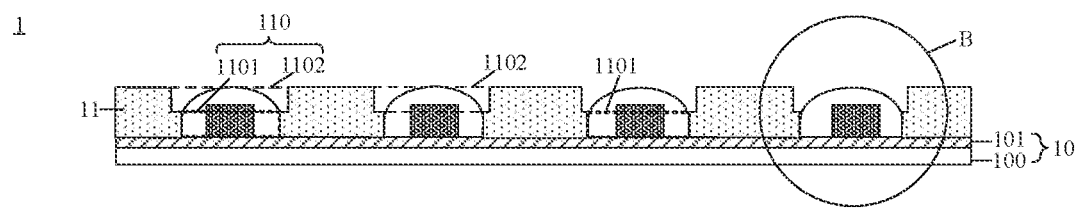
FIG. 4D is a structural diagram of still another backplane, in accordance with some embodiments.
Figure 4E:
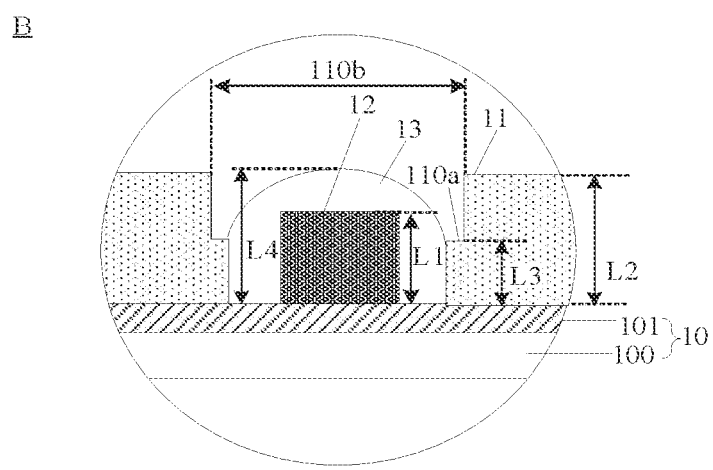
FIG. 4E is an enlarged structural view of the region B shown in in FIG. 4D.

As shown in FIGS. 4C and 4E, a wall of the through hole 110 has a protruding step 110a, the through hole 110 has an opening 110b away from the substrate 10, and an orthogonal projection of the protruding step 110a on the substrate 10 is located within an orthogonal projection of the opening 110b of the through hole 110 on the substrate 10. A third maximum distance L3 exists between the protruding step 110a and the bearing surface of the substrate 10, and a fourth maximum distance L4 exists between the light exit surface 130 of the optical structure 13 and the bearing surface of the substrate 10. The fourth maximum distance L4 is greater than the third maximum distance L3.

In some embodiments of the present disclosure, as shown in FIGS. 4A, 4B and 4D, the through hole 110 includes a first sub-through hole 1101 and a second sub-through hole 1102 disposed on a side, away from the substrate 10, of the first sub-through hole 1101. The first sub-through hole 1101 and the second sub-through hole 1102 are communicated with each other. A diameter of the first sub-through hole 1101 is smaller than a diameter of the second sub-through hole 1102. The optical structure 13 is in contact with at least a wall of the first sub-through hole 1101.

For example, as shown in FIG. 4A, a difference between a diameter d1 of the first sub-through hole 1101 and a diameter d2 of the second sub-through hole 1102 is in a range of approximately 0.4 mm to approximately 1.0 mm.

With reference to FIGS. 4A to 4E, for example, an orthogonal projection of the wall of the first sub-through hole 1101 on the substrate 10 is within an orthogonal projection of the wall of the second sub-through hole 1102 on the substrate 10. The first sub-through hole 1101 and the second sub-through hole 1102 may be arranged coaxially.

For example, as shown in FIGS. 4A to 4E, a longitudinal section of the through hole 110 in a thickness direction of the substrate 10 may be of a shape similar to a capital letter "T".

In some embodiments, as shown in FIGS. 4A and 4D, the optical structure 13 may be only in direct contact with the wall of the first sub-through hole 1101, but not in contact with a wall of the second sub-through hole 1102. In this way, it may be possible to use the wall of the first sub-through hole 1101 to restrict the formation of the optical structure 13, which facilitates the molding of the optical structure 13. In the meantime, it may be possible to avoid a problem that it is difficult to form the optical structure 13 into a good convex lens structure due to poor molding in a case where a transparent adhesive with low viscosity is adopted. In addition, there may be a certain adhesion between the optical structure 13 and the wall of the first sub-through hole 1101 during molding, which improves a stability of the optical structure 13 after being molded.

In some other embodiments, as shown in FIG. 4B, the optical structure 13 may be in direct contact with both the wall of the first sub-through hole 1101 and the wall of the second sub-through hole 1102. In this way, there may be adhesion between the optical structure 13 and each of the first sub-through hole 1101 and the second sub-through hole 1102, which improves the stability of the optical structure 13 after being molded.

For the backplane 1 provided in some embodiments of the present disclosure, since the diameter of the second sub-through hole 1102 is larger than the diameter of the first sub-through hole 1101, an alignment accuracy required for fabricating the optical structure 13 through the dispensing process may be reduced. In addition, since there is a gap between the light-emitting diode chip 12 and the wall of the first sub-through hole 1101, a portion of the light emitted by the light-emitting diode chip 12, which includes a portion of the total reflection light 20, may propagate from the gap toward the substrate 10. The smaller the gap, the more the portion of the light 2 that may be reflected by the first reflective layer 11, and the higher the light extraction efficiency of the light-emitting diode chip 12. Therefore, during the design, by setting the diameter of the first sub-through hole 1101 to be smaller than that of the second sub-through hole 1102, it may be possible to narrow the gap between the light-emitting diode chip 12 and the wall of the first sub-through hole 1101, and thereby increase the light extraction efficiency of the light-emitting diode chip 12.

As shown in FIGS. 4C and 4E, in these structures, the bearing surface of the substrate 10 is an upper surface of the circuit structure layer 101 (i.e., a surface thereof away from the base 100); and a first maximum distance L1 exists between a surface of the light-emitting diode chip 12 away from the bearing surface of the substrate 10 and the bearing surface of the substrate 10.

A second maximum distance L2 exists between a surface of the first reflective layer 11 away from the bearing surface of the substrate 10 and the bearing surface of the substrate 10.

As shown in FIGS. 4C and 4E, the first maximum distance L1 and the second maximum distance L2 are not equal.

In some embodiments of the present disclosure, as shown in FIG. 4C, the first maximum distance L1 is greater than the second maximum distance L2. That is to say, relative to the bearing surface of the substrate 10, the surface of the light-emitting diode chip 12 away from the bearing surface of the substrate 10 is higher than the surface of the first reflective layer 11 away from the substrate 10. In this structure, since the light-emitting diode chip 12 is relatively higher, it is conducive to increasing the curvature of the light exit surface 130 of the optical structure 13 during fabrication of the optical structure 13. As a result, it may be possible to further reduce the amount of the portion of the light 2 that is totally reflected and improve the light extraction efficiency of the light-emitting diode 12.

In some other embodiments of the present disclosure, as shown in FIG. 4E, the first maximum distance L1 is less than the second maximum distance L2. That is to say, relative to the bearing surface of the substrate 10, the surface of the light-emitting diode chip 12 away from the bearing surface of the substrate 10 is lower than the surface of the first reflective layer 11 away from the substrate 10. In this structure, since the light-emitting diode chip 12 is relatively lower, it may reduce the consumption of the transparent colloid material required for fabricating the optical structure 13 during fabrication of the optical structure 13. As a result, the production cost may be reduced.

Figure 5A:
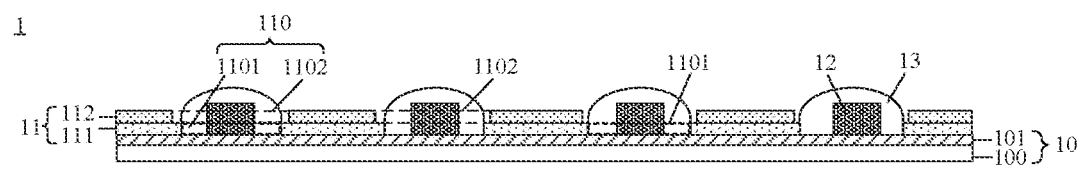
FIGS. 5A to 5C are structural diagrams of still other backplanes, in accordance with some embodiments.
Figure 5B:
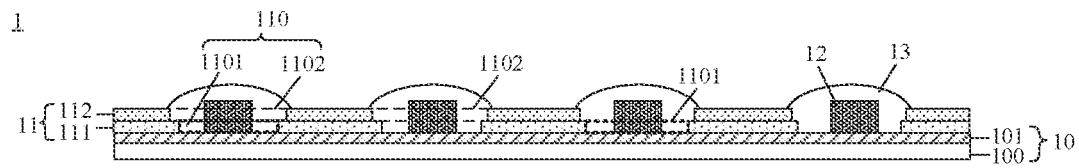
Figure 5C:
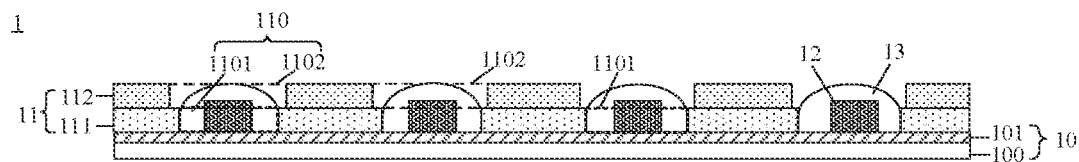

In some embodiments of the present disclosure, as shown in FIGS. 5A to 5C, the first reflective layer 11 includes a first reflective sub-layer 111 and a second reflective sub-layer 112. The first sub-through holes 1101 are located in the first reflective sub-layer 111. The second sub-through holes 1102 are located in the second reflective sub-layer 112.

Since the first reflective sub-layer 111 and the second reflective sub-layer 112 are separately fabricated in different steps, the first sub-through holes 1101 and the second sub-through holes 1102 may also be fabricated separately in different steps. In particular, in a case where the first through-holes 1101 and the second through-holes 1102 have different diameters, by fabricating them separately, it may be possible to reduce the difficulty of fabricating the through-holes 110.

In a case where the diameter of the first sub-through hole 1101 is less than the diameter of the second sub-through hole 1102 (that is, the second sub-through hole 1102 is expanded relative to the first sub-through hole 1101), it may be possible to avoid a problem that the second reflective sub-layer 112 covers pads exposed by the first sub-through holes 1101 due to a positional deviation of the second reflective sub-layer 112.

In some embodiments of the present disclosure, with continued reference to FIGS. 5A to 5C, the first reflective sub-layer 111 and the second reflective sub-layer 112 are both ink structure layers, and are both made of white ink.

The first reflective sub-layer 111 and the second reflective sub-layer 112 may be fabricated in two steps. For example, a first white ink layer (in solid-liquid mixed state) is formed first; after the first white ink layer is pre-cured, the first sub-through holes 1101 are formed by a patterning process; and then the first white ink layer is completely cured to complete the fabrication of the first sub-reflective layer 111. Afterward, a second white ink layer is formed on the first reflective sub-layer 111. Portions of the second white ink layer are located in the first sub-through holes 1101. In a subsequent patterning process of forming the second sub-through holes 1102, the etching solution will not react with the first reflective sub-layer 111 that has been completely cured, but will only react with the second white ink layer that has not been completely cured (which includes removing the uncured white ink that is located in the first sub-through holes 1101), so as to form the second sub-through holes 1102 and complete the fabrication of the reflective sub-layer 112.

Within a certain thickness range, the greater the thickness of the white ink layer, the higher the reflectivity of the white ink layer to the light 2. The first reflective layer 11 may be configured as a double-layer ink structure, so as to improve a reflectivity of the first reflective layer 11 to the light 2.

In some examples, as shown in FIG. 5A, relative to the bearing surface of the substrate 10, the surface of the light-emitting diode chip 12 away from the bearing surface of the substrate 10 is higher than a surface of the second sub-reflective layer 112 away from the substrate 10, and the optical structure 13 is in contact with the wall of the first sub-through hole 1101. In this way, the optical structure 13 may be formed into a good convex lens structure; and to a certain extent, the stability of the optical structure 13 after being molded may be ensured.

In some other examples, as shown in FIG. 5B, relative to the bearing surface of the substrate 10, the surface of the light-emitting diode chip 12 away from the bearing surface of the substrate 10 is higher than the surface of the second reflective sub-layer 112 away from the substrate 10, and the optical structure 13 is in contact with both the wall of the first sub-through hole 1101 and the wall of the second sub-through hole 1102. For example, the optical structure 13 may cover a portion of a surface of the second reflective sub-layer 112 (that is, a surface of the second reflective sub-layer 112 away from the first reflective sub-layer 111). In this way, the stability of the optical structure 13 after being molded may be further improved.

In still some other examples, as shown in FIG. 5C, relative to the bearing surface of the substrate 10, the surface of the light-emitting diode chip 12 away from the bearing surface of the substrate 10 is higher than a surface of the first reflective sub-layer 111 proximate to the second reflective sub-layer 112 and lower than the surface of the second reflective sub-layer 112 away from the substrate 10. That is, the surface of the light-emitting diode chip 12 away from the bearing surface of the substrate 10 is located between two surfaces of the second reflective sub-layer 112 in a thickness direction thereof. In this case, the optical structure 13 is in contact with the wall of the first sub-through hole 1101. In this way, the optical structure 13 may also be formed into a good convex lens structure; to a certain extent, the stability of the optical structure 13 after being molded may be ensured; and a consumption of material(s) used for forming the optical structure 13 may be reduced.

In some embodiments of the present disclosure, as shown in FIGS. 6A to 6D, the substrate 10 further includes a second reflective layer 14. A wall of the through hole 110 in the first reflective layer 11 and a corresponding light-emitting diode chip 12 (i.e., located in the through hole 110) have a gap therebetween. An orthogonal projection, on the base 100 (or the circuit structure layer 101), of the gap overlaps with an orthogonal projection, on the base 100 (or the circuit structure layer 101), of a portion of a surface of the second reflective layer 14 proximate to the first reflective layer 11. For example, in FIGS. 6A and 6B, the second reflective layer 14 is located on a side of the circuit structure layer 101 proximate to the first reflective layer 11. In this case, the gap may directly expose the portion of the surface of the second reflective layer 14 proximate to the first reflective layer 11. For another example, in FIGS. 6C and 6D, the second reflective layer 14 is located on a side of the circuit structure layer 101 away from the first reflective layer 11. In the example shown in FIG. 6C, orthogonal projections, on the base 100, of the gap, and the portion of the surface of the second reflective layer 14 proximate to the first reflective layer 11, and a light-transmitting region of the circuit structure layer 101 are overlapped with one another. In the example shown in FIG. 6D, the orthogonal projections, on the base 100, of the gap, and the portion of the surface of the second reflective layer 14 proximate to the first reflective layer 11, the light-transmitting region of the circuit structure layer 101 and a light-transmitting region of an insulating layer 15 are overlapped with one another.

Figure 6A:
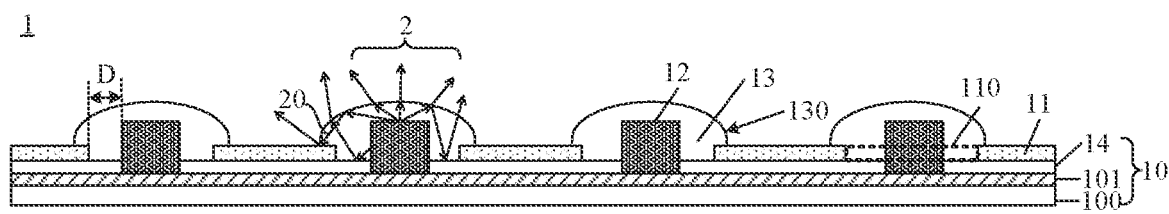
FIGS. 6A to 6D are structural diagrams of still other backplanes, in accordance with some embodiments.
Figure 6B:
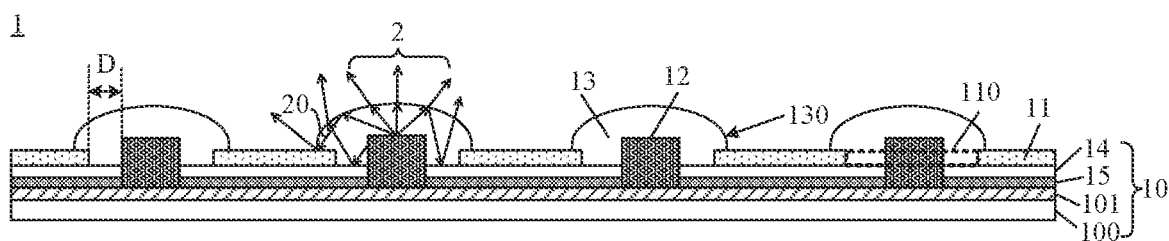

As shown in FIGS. 6A and 6B, the second reflective layer 14 includes a plurality of hollow-out portions. An orthogonal projection of at least one hollow-out portion on the base 100 (or the circuit structure layer 101) is located within an orthogonal projection of a through hole 110 in the first reflective layer 11 on the base 100 (or the circuit structure layer 101). In some examples, an orthogonal projection of a single hollow-out portion on the base 100 (or the circuit structure layer 101) may be located within the orthogonal projection of the through hole 110 on the base 100 (or the circuit structure layer 101). In this case, a single hollow-out portion exposes two pads of the circuit structure layer 101. In some other examples, orthogonal projections of two hollow-out portions on the base 100 (or the circuit structure layer 101) may be located within the orthogonal projection of the through hole 110 on the base 100 (or the circuit structure layer 101). In this case, each hollow-out portion may expose a single pad of the circuit structure layer 101.

In some embodiments of the present disclosure, a size of the gap D between the wall of the through hole 110 in the first reflective layer 11 and the corresponding light-emitting diode chip 12 may be, for example, in a range of approximately 1 μm to approximately 5 μm. In this case, the gap between the wall of the through hole 110 in the first reflective layer 11 and the corresponding light-emitting diode chip 12 may be filled with the material(s) for forming the optical structure 13. In this way, the light extraction efficiency and stability of the light-emitting diode chip 12 may be improved.

In the structures shown in FIGS. 6A and 6B, the bearing surface of the substrate 10 is an upper surface of the second reflective layer 14 (i.e., a surface thereof away from the base 100).

Figure 6C:
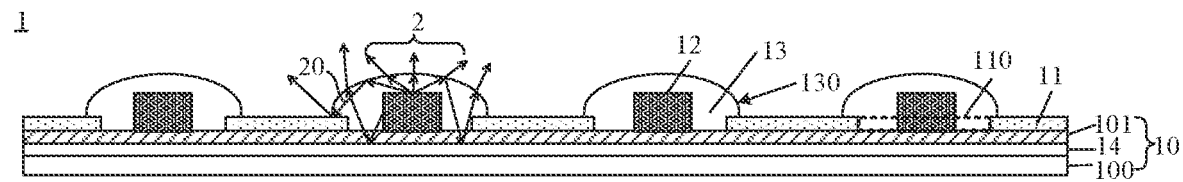
Figure 6D:
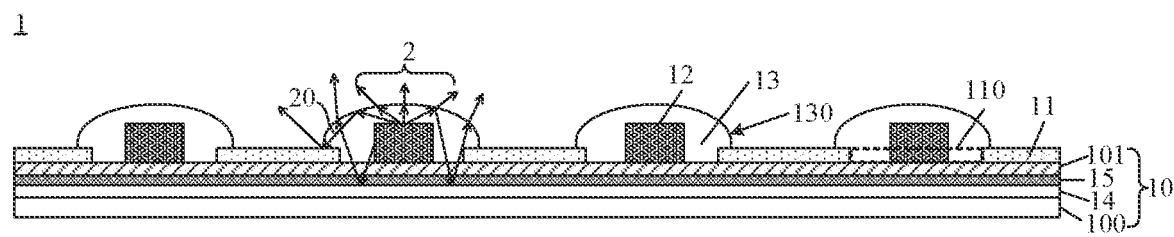

In the structures shown in FIGS. 6C and 6D, the bearing surface of the substrate 10 is an upper surface of the circuit structure layer 101 (i.e., a surface thereof away from the base 100).

The second reflective layer 14 may be made of a metal or a non-metal material. The metal material is, for example, silver or aluminum. The non-metal material is, for example, ink. The ink is, for example, white ink.

In some embodiments of the present disclosure, in a case where the second reflective layer 14 is made of a metal material, the second reflective layer 14 may be formed by a magnetron sputtering process.

In FIGS. 6A and 6B, the second reflective layer 14 is located on an upper side of the circuit structure layer 101 (i.e., a side thereof away from the base 100). In FIGS. 6C and 6D, the second reflective layer 14 is located on a lower side of the circuit structure layer 101 (i.e., a side thereof proximate to the base 100). Regardless of whether the second reflective layer 14 is located on the upper side or lower side of the circuit structure layer 101, in a case where the second reflective layer 14 is made of a conductive metal material, the second reflective layer 14 needs to be insulated from the circuit structure layer 101, so as to prevent the second reflective layer 14 from affecting the normal operation of the circuit structure layer 101. For example, an orthogonal projection of a pattern of the second reflective layer 14 does not overlap with an orthogonal projection of a conductive pattern (such as a conductive pattern in a metal wiring region) of the circuit structure layer 101 on the base. For another example, a transparent insulating layer needs to be provided between the second reflective layer 14 and the circuit structure layer 101. The insulating layer may be made of an organic material or an inorganic material, such as at least one of silicon oxide or silicon nitride. In some embodiments of the present disclosure, as shown in FIGS. 6B and 6D, an insulating layer 15 is provided between the second reflective layer 14 and the circuit structure layer 101.

Herein, the terms "upper side" and "lower side" are only used to describe some embodiments of the present disclosure with reference to FIGS. 6A and 6B, but are not used as qualifiers.

As shown in FIGS. 6A and 6B, the second reflective layer 14 is located on a side of the circuit structure layer 101 proximate to the first reflective layer 11. During fabrication, hollow-out portions need to be formed in the second reflective layer 14 or in both the second reflective layer 14 and the insulating layer 15, so as to expose the pads in the circuit structure layer 101.

As shown in FIGS. 6C and 6D, the second reflective layer 14 is located on a side of the circuit structure layer 101 away from the first reflective layer 11. When the portion of the light 2 propagating toward the substrate 10 reaches the second reflective layer 14, it will exit through the light exit surface 130 of the optical structure 13 after being reflected by the second reflective layer 14.

In some examples, there is a gap between the wall of the through hole 110 in the first reflective layer 11 and the corresponding light-emitting diode chip 12. In a case where a portion of the light 2 (including the total reflection light 20) passes through the gap and then reaches the substrate 10, since the second reflective layer 14 is provided in the substrate 10, the portion of the light 2 reaching the substrate 10 through the gap will be reflected by the second reflective layer 14 and exits through the light exit surface 130 of the optical structure 13. Therefore, the second reflective layer 14 may further improve the light extraction efficiency of the light-emitting diode chip 12.

In addition, in a case where the light-emitting diode chip 12 emits light in all directions (360 degrees, three-dimensional), at least one portion of the light emitted by the light-emitting diode chip 12 propagating toward a surface of the second reflective layer 14 may reach the second reflective layer 14 through a region in the layer between the light-emitting diode chip 12 and the second reflective layer 14. And then, after being reflected by the second reflective layer 14, the at least one portion of the light will exit through the light exit surface 130 of the optical structure 13, which may conducive to improving the light extraction efficiency of the light-emitting diode chip 12.

It will be noted that, there may not be a gap between the wall of the through hole 110 in the first reflective layer 11 and the light-emitting diode chip 12. In this case, since the light-emitting diode chip 12 emits light in all directions (360° degrees, three-dimensional), the second reflective layer 14 may still be used to improve the light extraction efficiency of the light-emitting diode chip 12.

In FIGS. 6C and 6D, the circuit structure layer 101 is located on an upper side of the second reflective layer 14; the circuit structure layer 101 has light-transmitting regions and non-light-transmitting regions, the non-light-transmitting regions are located in orthogonal projections of the light-emitting diode chips 12 on the circuit structure layer 101 are located, and the pads are located in the non-light-transmitting regions. A light-transmitting region is located between adjacent non-light-transmitting regions. Therefore, the portion of the light 2 reaching the substrate 10 through the gap between the light-emitting diode chip 12 and the wall of the through hole 110 and/or the portion of light 2 reaching the substrate 10 through the region between the light-emitting diode chip 12 and the second reflective layer 14 may still be reflected by the second reflective layer 14.

In some embodiments of the present disclosure, as shown in FIGS. 6A and 6B, the second reflective layer 14 is located on the side of the circuit structure layer 101 proximate to the first reflective layer 11. The second reflective layer 14 includes a plurality of hollow-out portions. A hollow-out portion in the plurality of hollow-out portions exposes at least one of the plurality of pads in the circuit structure layer 101. A single light-emitting diode chip 12 is electrically connected to two of the plurality of pads.

In a case where the second reflective layer 14 is located on the side of the circuit structure layer 101 proximate to the first reflective layer 11, it is convenient to fabricate the second reflective layer 14. In addition, since a distance between a surface of the second reflective layer 14 proximate to the first reflective layer 11 and the light exit surface 130 of the optical structure 13 is shorter, a distance that the light 2 travels to reach the second reflective layer 14 is also shorter, which reduces the loss of light and further improves the light extraction efficiency of the light-emitting diode chip 12.

Figure 7:
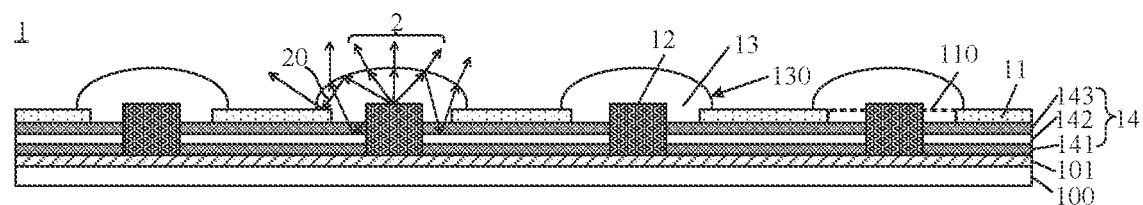
FIG. 7 is a structural diagram of still another backplane, in accordance with some embodiments.

In some embodiments of the present disclosure, as shown in FIG. 7, the second reflective layer 14 includes a first transparent insulating sub-layer 141, a metal reflective layer 142, and a second transparent insulating sub-layer 143 that are sequentially stacked in a thickness direction of the substrate 10.

In this structure, the second reflective layer 14 is an insulating structure as a whole, and thus the second reflective layer 14 may be located on the upper side or the lower side of the circuit structure layer 101. In addition, since the metal reflective layer 142 having a high reflectivity is arranged between two insulating layers, the light extraction efficiency of the light-emitting diode chip 12 may be further improved.

Figure 8:
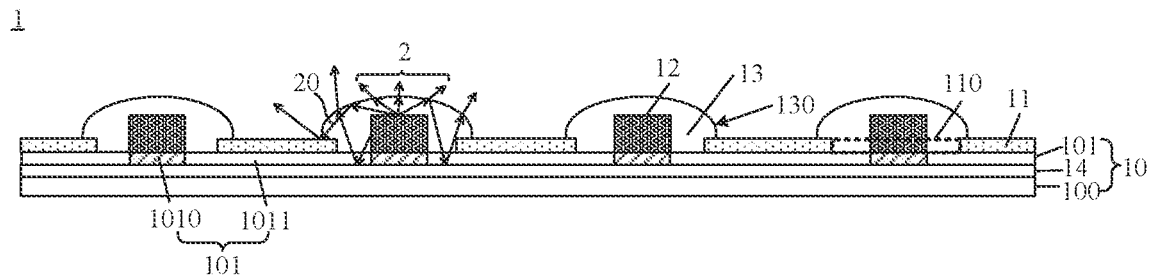
FIG. 8 is a structural diagram of still another backplane, in accordance with some embodiments.

In some embodiments of the present disclosure, as shown in FIG. 8, the second reflective layer 14 is located on the side of the circuit structure layer 101 away from the first reflective layer 11. The circuit structure layer 101 has a plurality of metal wiring regions 1010 and a plurality of light-transmitting regions 1011, and a light-transmitting region 1011 is located between two adjacent metal wiring regions 1010. The circuit structure layer 101 includes a plurality of pads. A metal wiring region 1010 is provided with pads therein. A single light-emitting diode chip 12 is electrically connected to two of the pads in the metal wiring region. The light-transmitting region 1011 is configured to transmit the portion of the light 2 emitted by the light-emitting diode chip 12 and reflected by the second reflective layer 14. The metal wiring region 1010 is a non-light-transmitting region.

The portion of the light 2 reaches the second reflective layer 14 through the light-transmitting region 1011, and will exit after being reflected by the second reflective layer 14. Therefore, the light extraction efficiency of the light-emitting diode chip 12 is relatively high.

Figure 9:
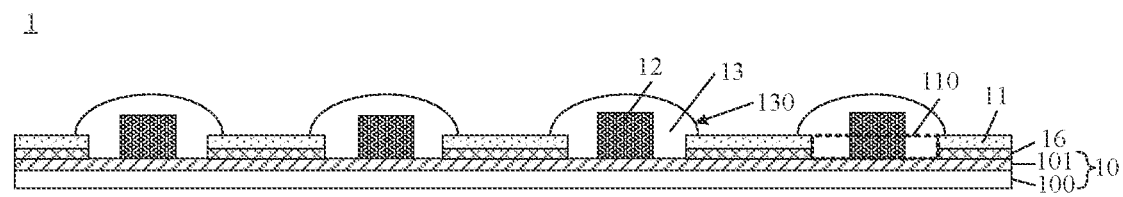
FIG. 9 is a structural diagram of still another backplane, in accordance with some embodiments.

In some embodiments of the present disclosure, as shown in FIG. 9, the backplane 1 further includes an adhesive layer 16. The adhesive layer 16 is located between the first reflective layer 11 and the substrate 10. The adhesive layer 16 is used for bonding the reflective layer 11 to the substrate 10.

The adhesive layer 16 may be made of, for example, acrylic adhesive.

In a case where the first reflective layer 11 is a reflective sheet, the reflective sheet may be bonded to the substrate 10 by the adhesive layer 16, so as to fix the first reflective layer 11 onto the substrate 10.

In some embodiments of the present disclosure, materials of the optical structure 13 include a transparent colloidal material and a fumed silica material. The fumed silica material may increase the viscosity of the transparent colloidal material, and thus facilitates the molding of the optical structure 13.

In some other embodiments of the present disclosure, materials of the optical structure 13 include a transparent colloidal material and a light conversion material mixed in the transparent colloidal material. The light conversion material is configured to convert a color of the light 2 emitted by the light-emitting diode chip 12.

In still some other embodiments of the present disclosure, materials of the optical structure 13 include a transparent colloidal material, a fumed silica material and a light conversion material.

The transparent colloid material is, for example, an encapsulating adhesive. The light conversion material is, for example, a phosphor, a quantum dot material, a perovskite material, etc.

In some embodiments of the present disclosure, in a case where the light-emitting diode chip 12 emits blue light, the light conversion material of the optical structure 13 may convert the blue light into white light, red light or green light.

Due to the light conversion material in the materials of the optical structure 13, a structure of the backplane 1 may be optimized, and a cost of the backplane 1 may be reduced.

Figure 10A:
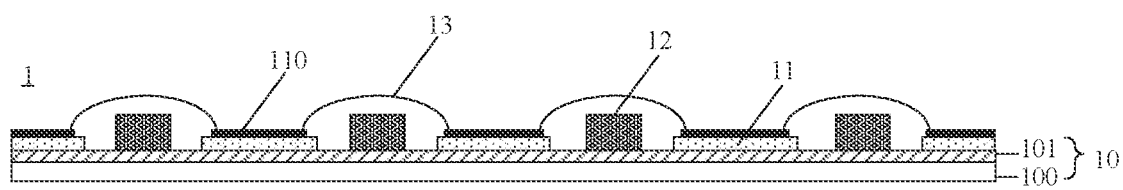
FIGS. 10A to 10C are structural diagrams of still other backplanes, in accordance with some embodiments.

In some embodiments of the present disclosure, as shown in FIG. 10A, the backplane 1 further includes a hydrophobic layer 110 located on a side of the first reflective layer 11 away from the substrate 10. The hydrophobic layer 110 includes a plurality of openings. An orthogonal projection, on the substrate 10, of a through hole in the plurality of through holes is located within an orthogonal projection, on the substrate 10, of an opening in the plurality of openings. A single optical structure 13 is located in a single opening.

The hydrophobic layer is made of a hydrophobic material, such as fluorinated polyethylene, fluorocarbon wax, or other fluorinated polymers.

The hydrophobic layer may make it difficult for adjacent optical structures 13 to stick together, and thus facilitates the molding of the optical structures 13.

Figure 10B:
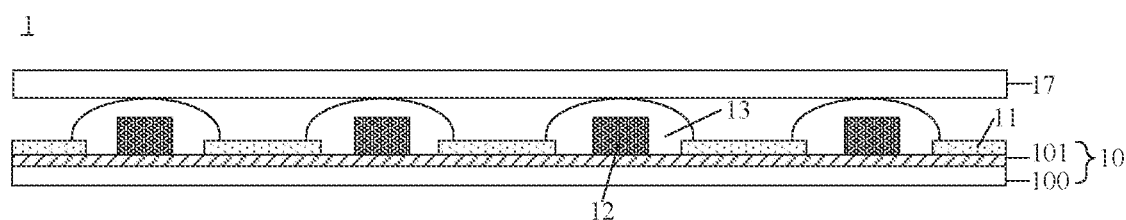
Figure 10C:
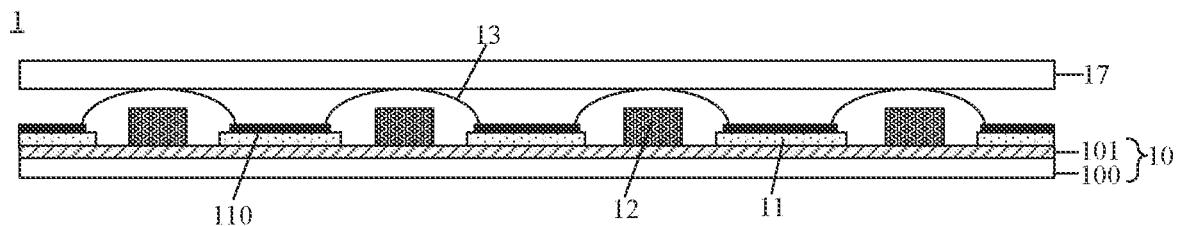

In some embodiments of the present disclosure, as shown in FIGS. 10B and 10C, in a case where the optical structure 13 does not include a light conversion material, the backplane 1 further includes a light conversion layer 17. The light conversion layer 17 is located on a side of the optical structures 13 away from the substrate 10.

For example, the light conversion layer 17 may be able to convert light 2 emitted by the light-emitting diode chip 12, which emits light of at least one of the three primary colors, into white light. For example, the light conversion layer 17 may convert blue light emitted by the light-emitting diode chip 12 into white light.

The conversion efficiency and effect of using the light conversion layer 17 to convert the color of the light emitted by the light-emitting diode chip 12 are relatively good, which improves the quality of light emitted from the backplane 1 and ensures a display effect of a display device having the backplane 1.

In some embodiments of the present disclosure, the backplane 1 may be used as a backlight module. On this basis, for example, the backplane 1 may further include a lower diffusion film, an upper diffusion film and a prism film that are sequentially disposed at a light exit side of the backplane 1. In a case where the backplane 1 includes the light conversion layer 17, the light conversion layer 17 may be provided between the lower diffusion film and the upper diffusion film. The light conversion layer 17 may be a quantum dot film. The prism film and the upper diffusion film may make the light emitted from the backplane 1, which is used as a backlight module, more uniform, and may thus improve a light output effect.

In some other embodiments of the present disclosure, the light-emitting diode chips 12 in the backplane 1 may be directly used as pixels for display. That is, the backplane 1 may be used as a display substrate. For example, the display substrate is a display substrate in a mini LED display device or a micro LED display device.

Figure 11:
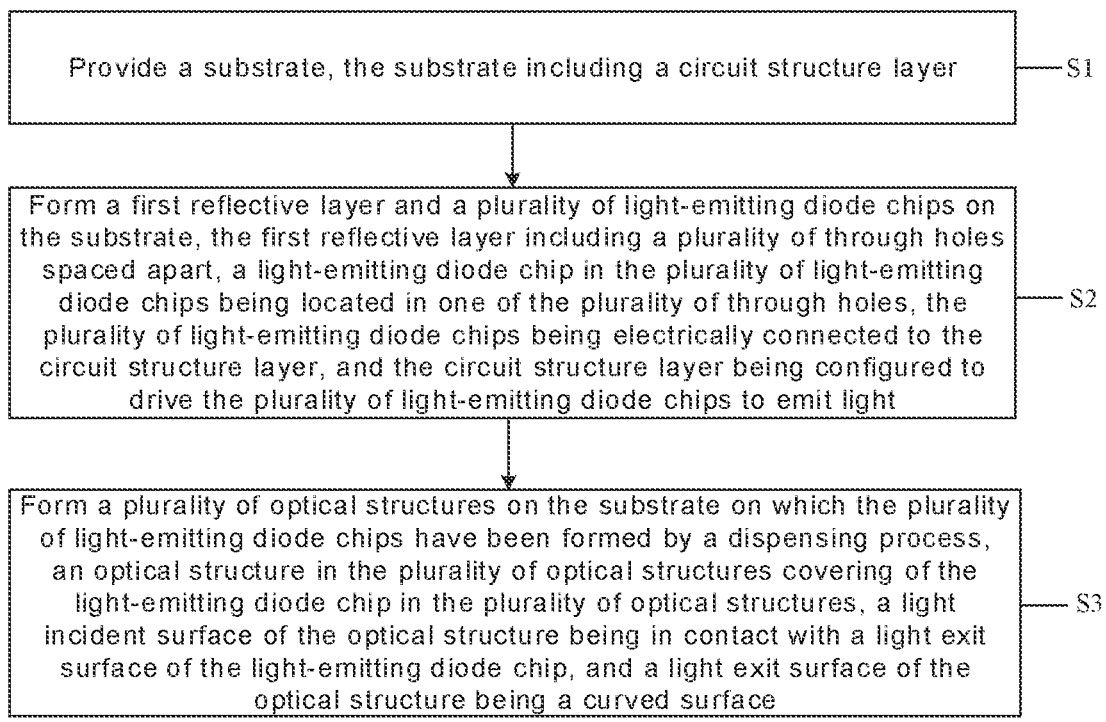
FIG. 11 is a flow chart of a method for manufacturing a backplane, in accordance with some embodiments.

Some embodiments of the present disclosure provide a method for manufacturing the backplane 1. As shown in FIG. 11, the method for manufacturing the backplane 1 includes steps 1 to 3 (S1 to S3).

In S1, a substrate 10 is provided. The substrate 10 includes a circuit structure layer 101.

In S2, a first reflective layer 11 and a plurality of light-emitting diode chips 12 are formed on the substrate 10. The first reflective layer 11 includes a plurality of through holes 110 spaced apart. A light-emitting diode chip 12 in the plurality of light-emitting diode chips 12 is located in one of the plurality of through holes 110. The plurality of light-emitting diode chips 12 are electrically connected to the circuit structure layer 101. The circuit structure layer 101 is configured to drive the plurality of light-emitting diode chips 12 to emit light.

In S3, a plurality of optical structures 13 are formed on the substrate 10 on which the plurality of light-emitting diode chips 12 have been formed through a dispensing process. An optical structure 13 in the plurality of optical structures 13 covers the light-emitting diode chip 12 in the plurality of light-emitting diode chips 12. A light incident surface of the optical structure 13 is in contact with a light exit surface of the light-emitting diode chip 12. A light exit surface 130 of the optical structure 13 is a curved surface.

In some embodiments of the present disclosure, material(s) of the optical structure 13 include, for example, a transparent colloidal material.

In some embodiments of the present disclosure, materials of the optical structure 13 may further include a fumed silica material in addition to the transparent colloidal material. The fumed silica material may increase the viscosity of the transparent colloidal material, and thus facilitates the molding of the optical structure 13.

The method for manufacturing the backplane 1 has the same beneficial effects as the backplane 1 described above, and details will not be repeated here.

Figure 12A:
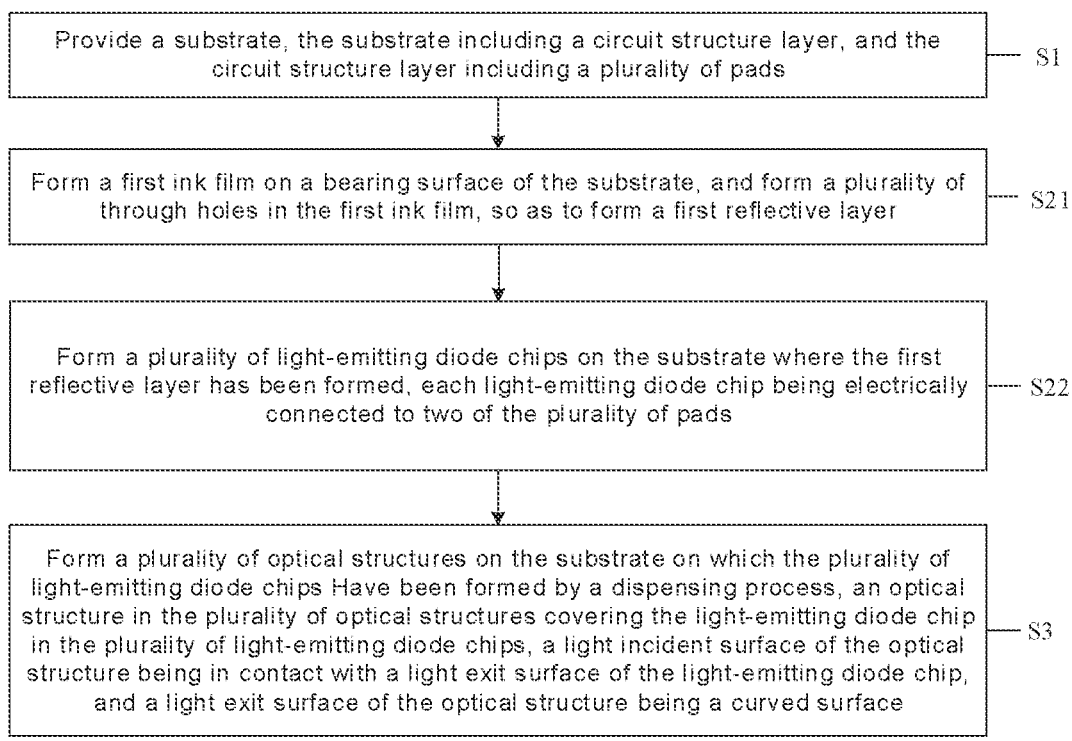
FIG. 12A is a flow chart of a method for manufacturing another backplane, in accordance with some embodiments.

In some embodiments of the present disclosure, as shown in FIG. 2D, the circuit structure layer 101 includes a plurality of pads 1012. On this basis, as shown in FIG. 12A, forming the first reflective layer 11 and the plurality of light-emitting diode chips 12 on the substrate 10 (S2) includes the steps 21 to 22 (S21 to S22).

Figure 12B:
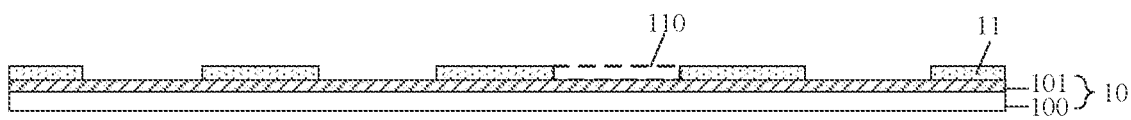
FIGS. 12B to 12C are diagrams showing a manufacturing process of a backplane, in accordance with some embodiments.

In S21, as shown in FIG. 12B, a first ink film is formed on a bearing surface of the substrate 10, and a plurality of through holes 110 are formed in the first ink film, so as to form the first reflective layer 11.

The first ink film is made of white ink. The first ink film may be formed by a screen printing process or by a coating process.

The plurality of through holes 110 may be formed in the first ink film by, for example, a patterning process.

For example, the substrate 10 further includes a base 100, and the circuit structure layer 101 is disposed on the base 100; and the bearing surface of the substrate 10 is an upper surface of the circuit structure layer 101 (i.e., a surface thereof away from the base 100).

Figure 12C:
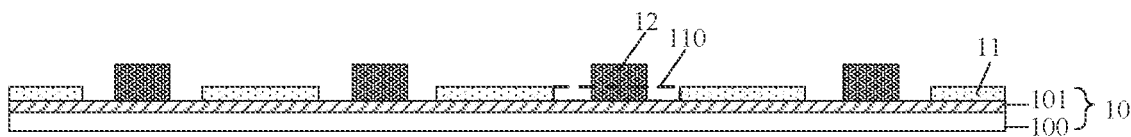

In S22, as shown in FIG. 12C, the plurality of light-emitting diode chips 12 are formed on the substrate 10 on which the first reflective layer 11 has been formed, and each light-emitting diode chip 12 in the plurality of light-emitting diode chips 12 is electrically connected to two of the plurality of pads 1012 (as shown in FIG. 2D).

In some embodiments of the present disclosure, the light-emitting diode chips 12 are LED chips for emitting blue light.

In some embodiments of the present disclosure, materials of the optical structure 13 may further include a light conversion material in addition to the transparent colloidal material.

Figure 13A:
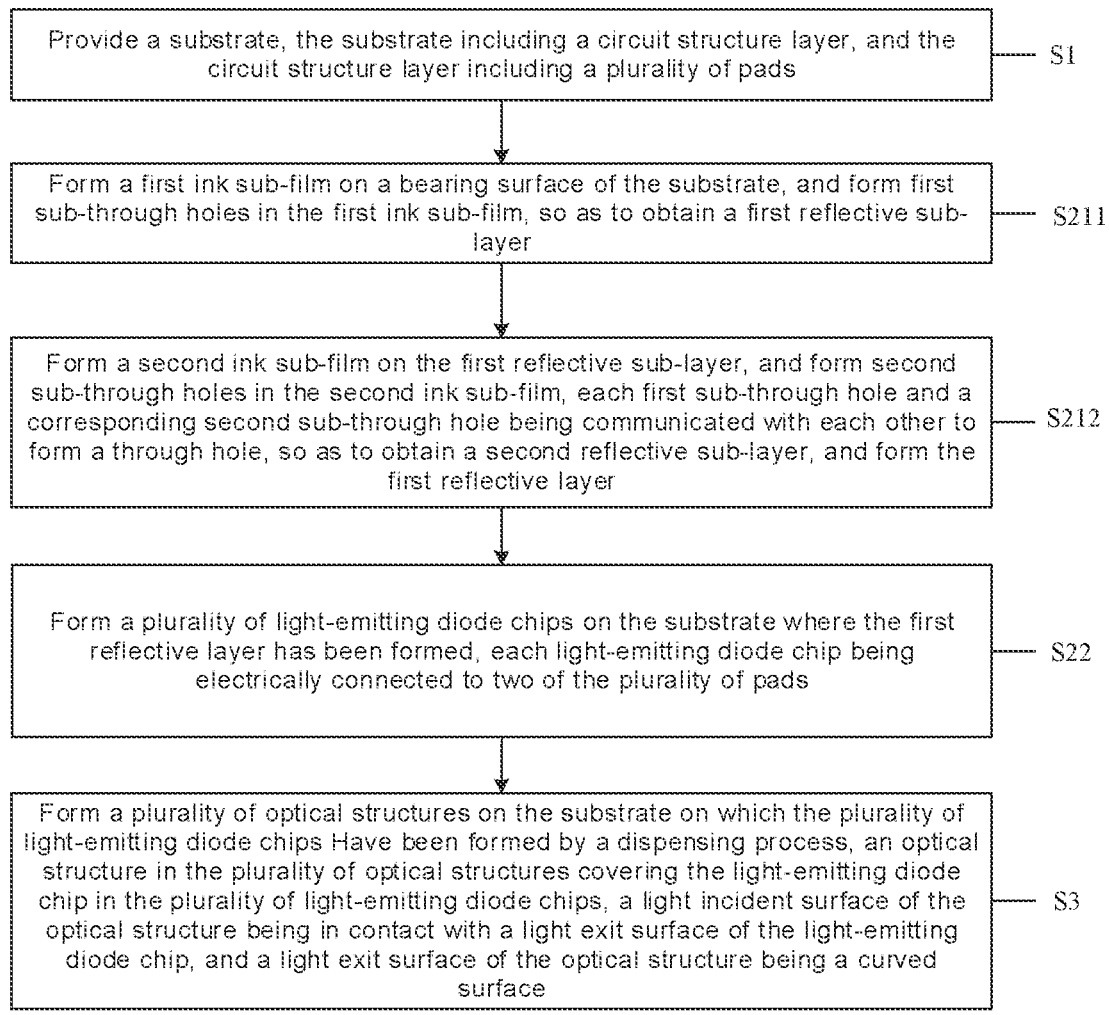
FIG. 13A is a flow chart of a method for manufacturing still another backplane, in accordance with some embodiments.

In some embodiments of the present disclosure, as shown in FIG. 13A, forming the first reflective layer 11 (S21) includes steps 211 to 212 (S211 to S212).

Figure 13B:
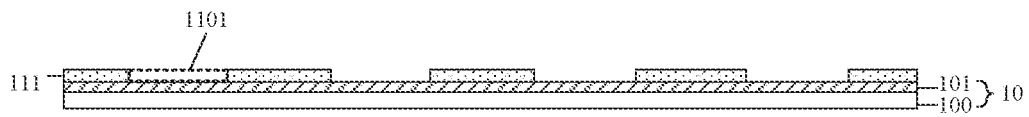
FIGS. 13B to 13C are diagrams showing a manufacturing process of another backplane, in accordance with some embodiments.

In S211, as shown in FIG. 13B, a first ink sub-film is formed on the bearing surface of the substrate 10, and first sub-through holes 1101 are formed in the first ink sub-film, so as to obtain a first reflective sub-layer 111.

Figure 13C:
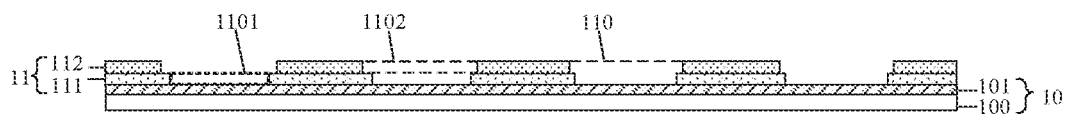

In S212, as shown in FIG. 13C, a second ink sub-film is formed on the first reflective sub-layer 111, and second sub-through holes 1102 are formed in the second ink sub-film; each second sub-through hole 1102 and a corresponding first sub-through hole 1101 are communicated with each other to form the through hole 110, so as to obtain a second reflective sub-layer 112, and form the first reflective layer 11.

In some embodiments of the present disclosure, the second ink sub-film is made of the same material and fabricated by the same process as the first ink sub-film. The second sub-through holes 1102 are fabricated by the same process as the first sub-through holes 1101.

In some embodiments of the present disclosure, a diameter of the first sub-through holes 1101 is smaller than a diameter of the second sub-through holes 1102.

By setting the diameter of the second sub-through hole 1102 to be larger, it may help reduce the alignment accuracy required for the dispensing process. In addition, the double-layer ink structure may facilitate the molding of the optical structure 13, and improve the reflectivity of the first reflective layer 11.

Figure 14A:
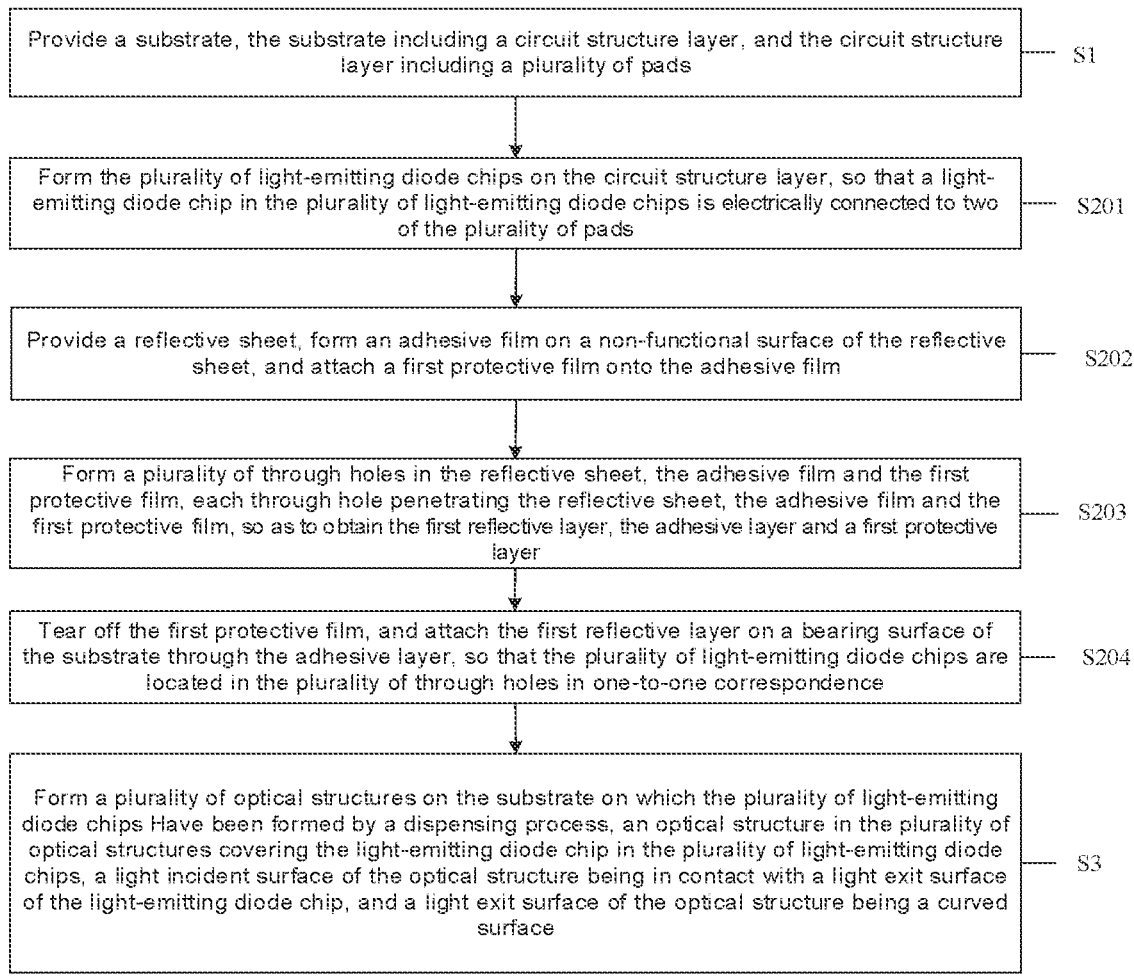
FIG. 14A is a flow chart of a method for manufacturing still another backplane, in accordance with some embodiments.

In some other embodiments of the present disclosure, as shown in FIG. 2D, the circuit structure layer 101 includes a plurality of pads 1012. As shown in FIG. 14A, forming the first reflective layer 11 and the plurality of light-emitting diode chips 12 on the substrate 10 (S2) includes steps 201 to 204 (S201 to S204).

Figure 14B:
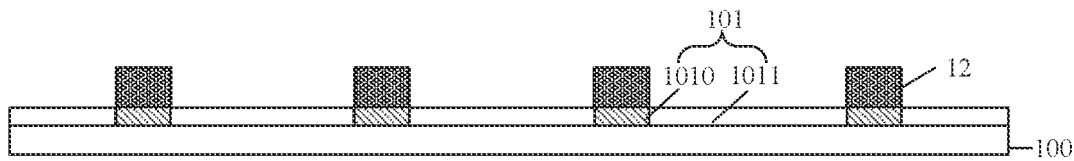
FIGS. 14B to 14G are diagrams showing a manufacturing process of still another backplane, in accordance with some embodiments.

In S201, as shown in FIG. 14B, the plurality of light-emitting diode chips 12 are formed on the circuit structure layer 101, so that a light-emitting diode chip in the plurality of light-emitting diode chips 12 is electrically connected to two of the plurality of pads.

The circuit structure layer 101 has metal wiring regions 1010 and light-transmitting regions 1011. The pads may be located in the metal wiring regions 1010.

Figure 14C:
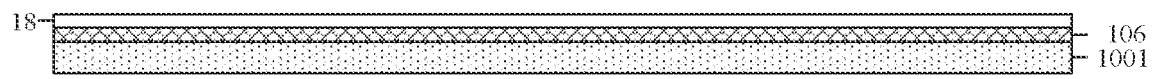

In S202, as shown in FIG. 14C, a reflective sheet 1001 is provided, an adhesive film 106 is formed on a non-functional surface of the reflective sheet 1001, and a first protective film 18 is attached onto the adhesive film 106.

An adhesive may be evenly formed on the non-functional surface of the reflective sheet by a coating process or by a slit coating process, so as to form the adhesive film 106.

The non-functional surface of the reflective sheet 1001 is a surface, proximate to a base 100 of the substrate 10, of the reflective sheet. In other words, a functional surface of the reflective sheet is a surface, away from the base 100 of the substrate 10, of the reflective sheet.

In some examples, a reflectivity of the functional surface of the reflective sheet is greater than a reflectivity of the non-functional surface of the reflective sheet, which may be used to distinguish the functional surface and non-functional surface of the reflective sheet.

A thickness of the adhesive layer 16 may be in a range of approximately 10 μm to approximately 50 μm. A peeling force between the adhesive layer 16 and the substrate 10 is, for example, greater than 50 gf.

In this structure, the reflective sheet 1001 is used for forming the first reflective layer 11. The reflectivity of the functional surface of the reflective sheet to the light 2 may reach 98%, which is quite high.

Figure 14D:
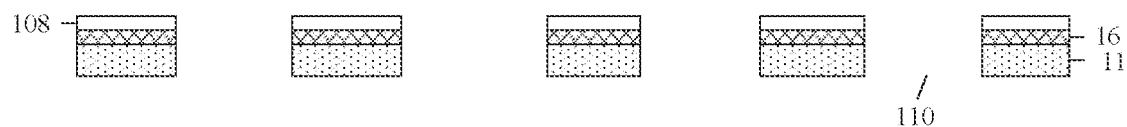

In S203, as shown in FIG. 14D, a plurality of through holes 110 are formed in the reflective sheet 1001, the adhesive film 106 and the first protective film 18, and each through hole 110 penetrates through the reflective sheet 1001, the adhesive film 106 and the first protective film 18, so as to obtain the first reflective layer 11, the adhesive layer 16 and a first protective layer 108.

The through hole 110 may be formed by, for example, a laser drilling process, a mechanical cutting process, a chemical etching process, or any other method. In a case where the through hole 110 is formed by the mechanical cutting process, a high reflectivity of a cut surface may be ensured.

Figure 14E:
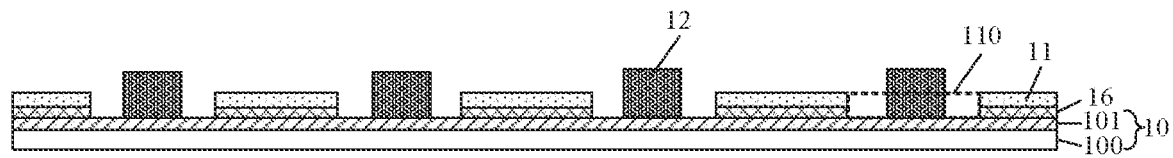

In S204, as shown in FIG. 14E, the first protective layer 108 is torn off, and the first reflective layer 11 is attached to the bearing surface of the substrate 10 through the adhesive layer 16, so that the plurality of light-emitting diode chips 12 are located in the plurality of through holes 110 in one-to-one correspondence.

When the first reflective layer 11 is attached to the substrate 10, the first reflective layer 11 needs to be aligned with the substrate 10, so as to make the through hole 110 in the reflective sheet correspond to at least one pad on the substrate 10. The alignment may be implemented, for example, through a manual jig or an automated optical inspection device (i.e., an automatic jig).

The step of attaching the first reflective layer 11 to the substrate 10 may be implemented by using a jig to press the first reflective layer 11 or by using a sealed high-pressure chamber. The jig is, for example, a roller. The sealed high-pressure chamber may use air pressure to make the reflective sheet adhere to the substrate 10.

As shown in FIG. 14E, if the first reflective layer 11 is attached to the substrate 10 by using a roller to press the reflective sheet, since the surface of the light-emitting diode chip 12 away from the substrate 10 is higher than an upper surface of the first reflective layer 11 (i.e., a surface thereof away from the substrate 10), the roller may damage the light-emitting diode chip 12.

Figure 14F:
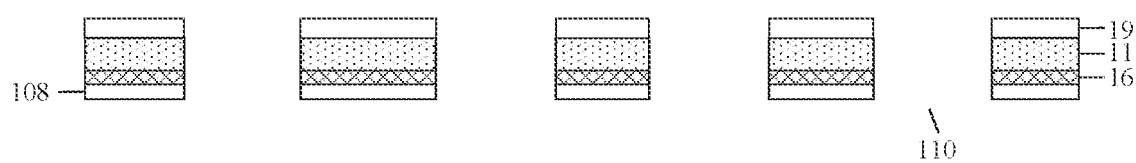
Figure 14G:
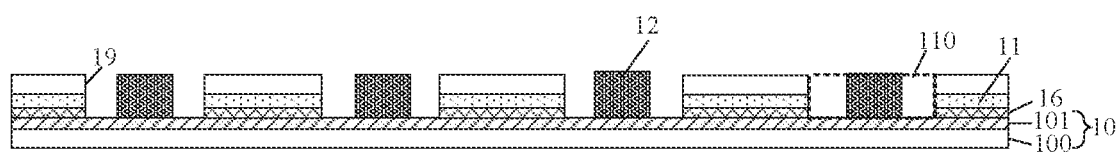
Figure 17:
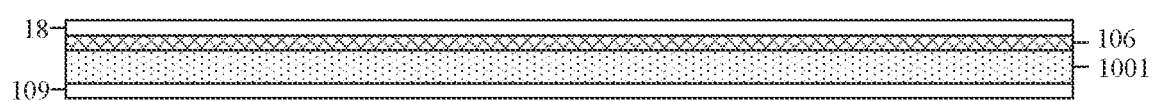
FIG. 17 is a diagram showing a process of forming a second protective film, in accordance with some embodiments.

In view of this, in some embodiments, a second protective film may be attached to the functional surface of the reflective sheet. The second protective film may be a piece of release paper. A structure after the second protective film 109 is attached to the reflective sheet 1001 is shown in FIG. 17. A total thickness of the second protective film 109, the reflective sheet 1001 and the adhesive film 106 is greater than or equal to a thickness of the light-emitting diode chip 12. The specific thickness difference needs to be determined in consideration of an amount of compression caused during pressing and attaching, so as to ensure that the light-emitting diode chip 12 will not be damaged. For example, the smaller the thickness difference between the total thickness of the second protective film 109, the reflective sheet 1001 and the adhesive film 106 and the thickness of the light-emitting diode chip 12, the better. This is because a small thickness difference facilitates the propagation of light around the light-emitting diode chip. Then, a plurality of through holes are formed in the second protective film 109, the reflective sheet 1001, the adhesive film 106 and the first protective film 18, so as to form a structure including the second protective layer 19, the first reflective layer 11, the adhesive layer 16 and the first protective layer 108 shown in FIG. 14F. As shown in FIG. 14G, after the step of aligning the first reflective layer 11 (which is provided with the second protective layer 19 thereon) and the substrate 10 is completed, it needs to be ensured that an upper surface of the second protective layer 19 is higher than or approximately flush with an upper surface of the light-emitting diode chip 12. And then, the roller may be used to press the second protective layer 19 to make the first reflective layer 11 closely adhere to the substrate 10. After the pressing step is completed, the second protective layer 19 may be torn off.

It will be noted that, in a case where the upper surface of the first reflective layer 11 is higher than or approximately flush with the upper surface of the light-emitting diode chip 12, the roller may be directly used to press the first reflective layer 11. In this structure, there may not be a need to attach the second protective film 19 to the reflective sheet.

The method for manufacturing the backplane 1 has the same beneficial effects as the backplane 1 described above, and details will not be repeated here.

Figure 15:
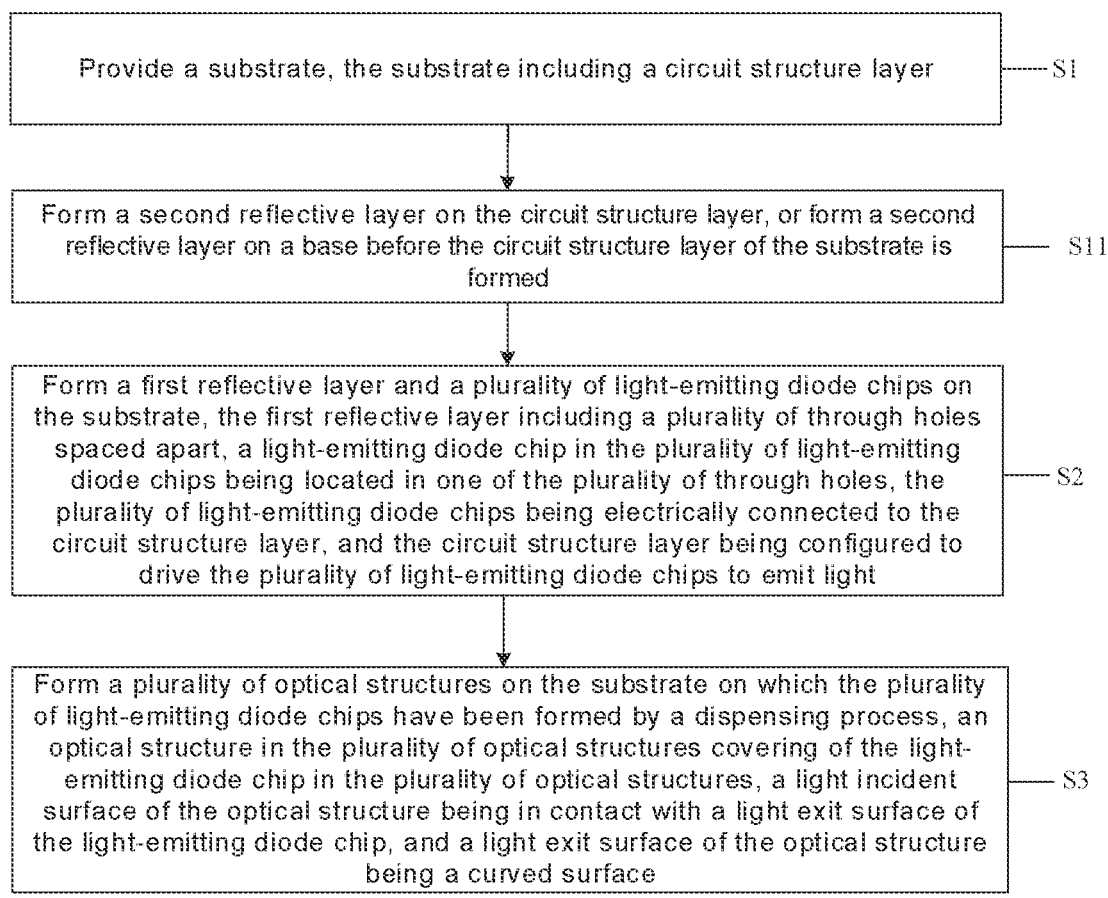
FIG. 15 is a flow chart of a method for manufacturing still another backplane, in accordance with some embodiments.

In some embodiments of the present disclosure, as shown in FIGS. 6A, 6C and 15, the method for manufacturing the substrate 10 further includes the step 11 (S11).

In S11, a second reflective layer 14 is formed on the circuit structure layer 101; or a second reflective layer 14 is formed on the base 100 before the circuit structure layer 101 of the substrate 10 is formed.

In some examples, as shown in FIG. 6A, the second reflective layer 14 is located on a surface of the circuit structure layer 101 away from the base 100.

In some other examples, as shown in FIG. 6C, the second reflective layer 14 is located between the circuit structure layer 101 and the base 100.

Figure 16A:
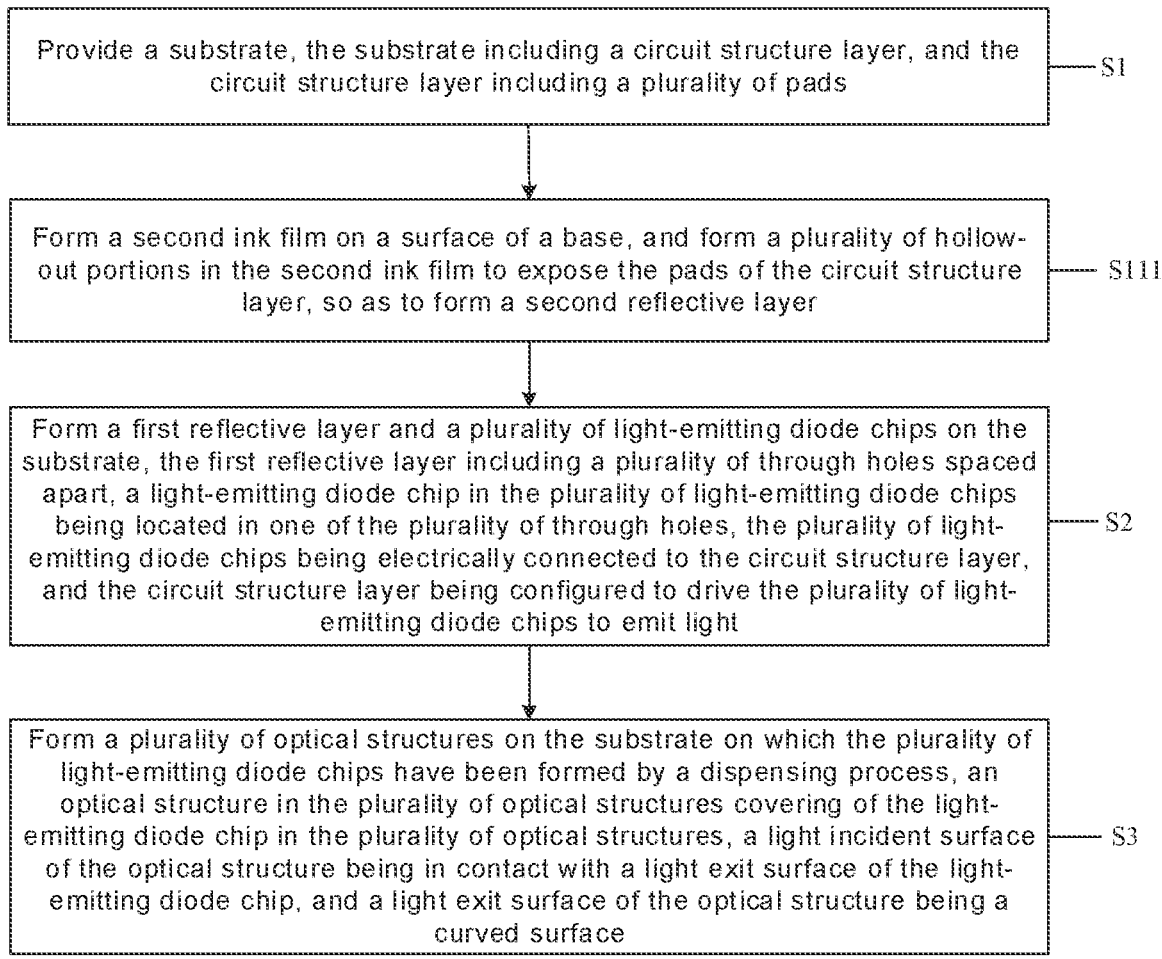
FIG. 16A is a flow chart of a method for manufacturing still another backplane, in accordance with some embodiments.

In some embodiments of the present disclosure, with reference to FIG. 16A, forming the second reflective layer 14 on the circuit structure layer 101 includes step 111 (S111).

Figure 16B:
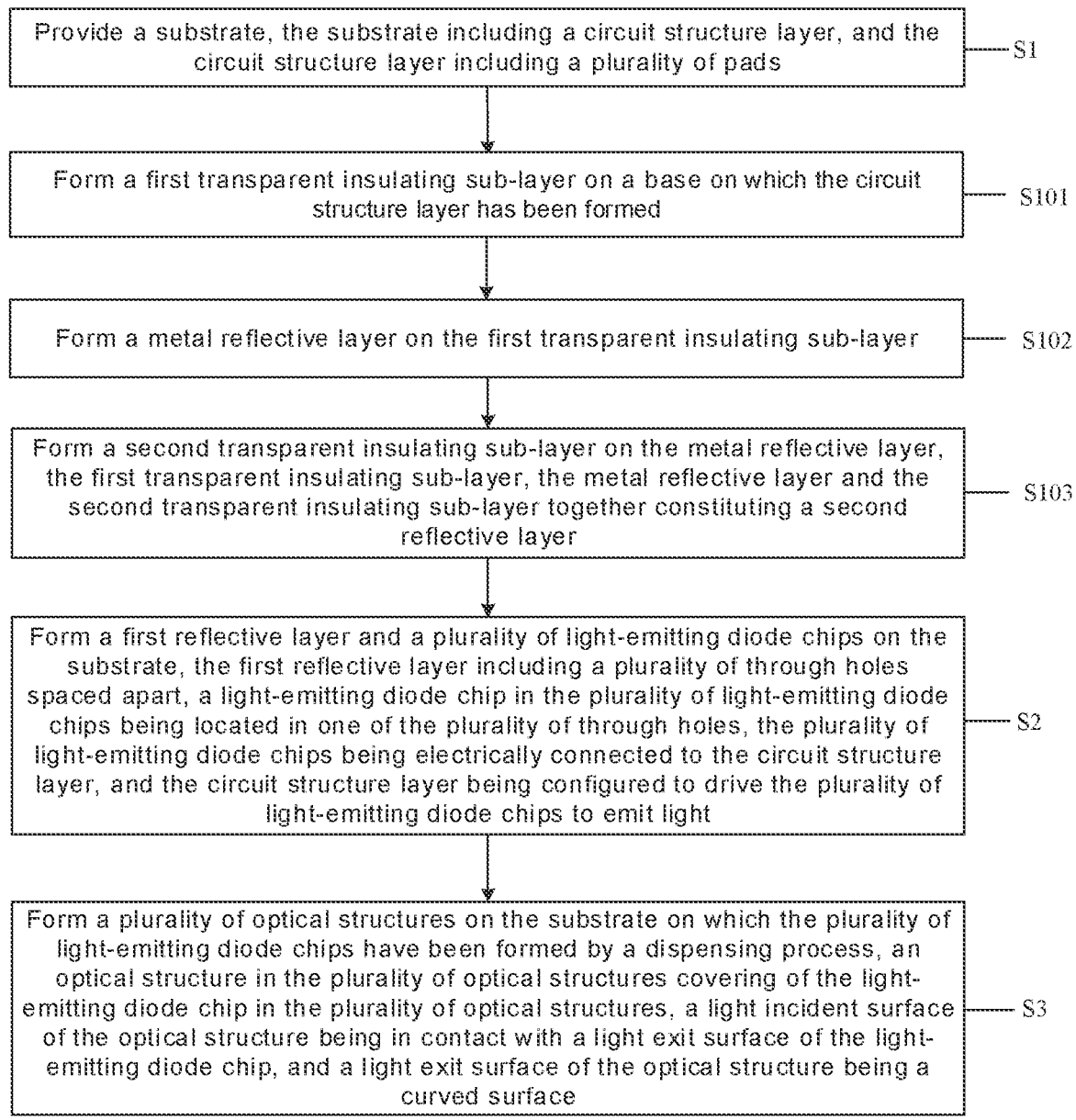
FIG. 16B is a flow chart of a method for manufacturing still another backplane, in accordance with some embodiments.
Figure 16C:
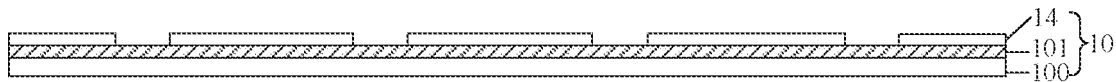
FIGS. 16C to 16F are diagrams showing a manufacturing process of still another backplane, in accordance with some embodiments.

In S111, as shown in FIG. 16C, a second ink film is formed on the base 100 on which the circuit structure layer 101 has been formed, and a plurality of hollow-out portions are formed in the second ink film to expose the pads of the circuit structure layer 101, so as to form the second reflective layer 14.

The second ink film may be made of the same material as the first ink film.

In some other embodiments of the present disclosure, as shown in FIG. 16B, forming the second reflective layer 14 on the circuit structure layer 101 includes steps 101 to 103 (S101 to S103).

Figure 16D:
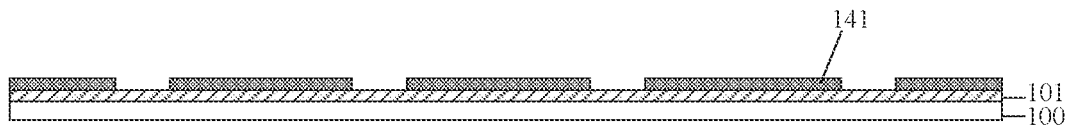

In S101, as shown in FIG. 16D, a first transparent insulating sub-layer 141 is formed on the base 100 on which the circuit structure layer 101 has been formed.

In some embodiments of the present disclosure, the first transparent insulating sub-layer 141 is made of, for example, one of polyimide and plastic.

The pads need to be exposed when the first transparent insulating sub-layer 141 is formed.

Figure 16E:
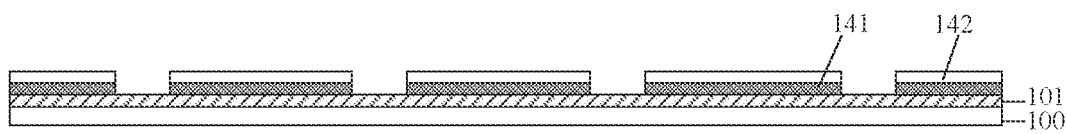

In S102, as shown in FIG. 16E, a metal reflective layer 142 is formed on the first transparent insulating sub-layer 141.

In some embodiments of the present disclosure, the metal reflective layer 142 is made of, for example, aluminum (Al).

Figure 16F:
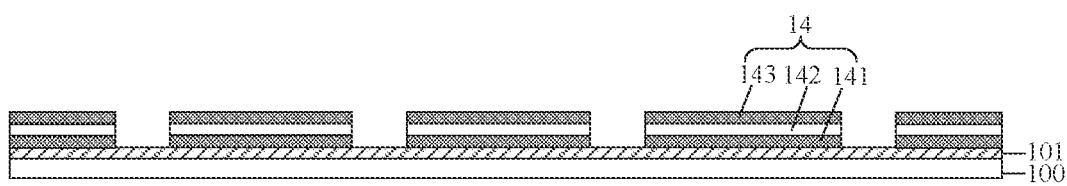

In S103, as shown in FIG. 16F, a second transparent insulating sub-layer 143 is formed on the metal reflective layer 142. The first transparent insulating sub-layer 141, the metal reflective layer 142 and the second transparent insulating sub-layer 143 together constitute the second reflective layer 14.

The first transparent insulating sub-layer 141, the metal reflective layer 142 and the second transparent insulating sub-layer 143 each have sub-holes therein, and a sub-hole in the first transparent insulating sub-layer 141, a sub-hole in the metal reflective layer 142, and a sub-hole in the second transparent insulating sub-layer 143 are communicated with one another to form a through hole in the second reflective layer 14.

In some embodiments of the present disclosure, the second transparent insulating sub-layer 143 is made of, for example, one of polyimide and plastic.

The process of forming the second reflective layer 14 is relatively simple. In addition, the total reflection light 20 and a portion of the light 2 propagating toward the substrate 10 reach the second reflective layer 14 at relatively short distances with less loss.

In some embodiments of the present disclosure, forming the plurality of optical structures 13 through the dispensing process includes:

forming the plurality of optical structures 13 by using materials including a transparent colloid material and a light conversion material that are mixed through the dispensing process, the light conversion material being configured to convert a color of the light 2 emitted by the light-emitting diode chips 12.

In some embodiments of the present disclosure, the light conversion material is, for example, a quantum dot material. The quantum dot material has relatively high light conversion efficiency.

With this design, a structure of the backplane 1 may be simplified, and the production cost may be reduced.

In some embodiments of the present disclosure, the dispensing process may be a syringe dispensing process. In this way, the accuracy of the dispensing process may be improved.

Herein, a person skilled in the art will understand that, the light extraction efficiency of the light-emitting diode chip 12 refers to the quotient of an amount of light coming out of the backplane divided by an amount of light emitted by all the light-emitting diode chips.

The foregoing descriptions are merely specific implementations of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A backplane, comprising:
   a substrate including a circuit structure layer and a second reflective layer;
   a first reflective layer disposed on a bearing surface of the substrate, the first reflective layer including a plurality of through holes spaced apart;
   a plurality of light-emitting diode chips, a light-emitting diode chip in the plurality of light-emitting diode chips being located in one of the plurality of through holes, the plurality of light-emitting diode chips being electrically connected to the circuit structure layer, the circuit structure layer being configured to drive the plurality of light-emitting diode chips to emit light; and
   a plurality of optical structures, an optical structure in the plurality of optical structures covering the light-emitting diode chip in the plurality of light-emitting diode chips, a light incident surface of the optical structure being in contact with a light exit surface of the light-emitting diode chip, and a light exit surface of the optical structure being a curved surface;
   wherein the first reflective layer, the second reflective layer and the circuit structure layer are disposed in respective different layers; and the second reflective layer and the circuit structure layer are located on a same side of the first reflective layer;
   wherein the first reflective layer is in contact with the second reflective layer.

2. The backplane according to claim 1, wherein the light exit surface of the optical structure is a convex surface that protrudes toward a side of the light-emitting diode chip away from the substrate.

3. The backplane according to claim 1, wherein an orthogonal projection of the optical structure on the substrate overlaps with an orthogonal projection of a wall of the through hole on the substrate.

4. The backplane according to claim 1, wherein the optical structure has a bottom surface relative to the light incident surface; and
   the optical structure is in contact with a wall of the through hole, a region of the optical structure in contact with the wall of the through hole has a protruding portion, and a distance exists between the protruding portion and the bottom surface.

5. The backplane according to claim 1, wherein the through hole includes a first sub-through hole and a second sub-through hole disposed on a side, away from the substrate, of the first sub-through hole, wherein
   a diameter of the first sub-through hole is smaller than a diameter of the second sub-through hole; and
   the optical structure is in contact with at least a wall of the first sub-through hole.

6. The backplane according to claim 5, wherein an orthogonal projection of the wall of the first sub-through hole on the substrate is located within an orthogonal projection of a wall of the second sub-through hole on the substrate.

7. The backplane according to claim 5, wherein the optical structure is further in contact with a wall of the second sub-through hole.

8. The backplane according to claim 5, wherein the first reflective layer includes a first reflective sub-layer and a second reflective sub-layer; the first sub-through hole is disposed in the first reflective sub-layer, and the second sub-through hole is disposed in the second reflective sub-layer.

9. The backplane according to claim 1, wherein the first reflective layer is an ink structure layer; or
the first reflective layer is a white reflective sheet, and the white reflective sheet includes a plurality of micro air bubbles.

10. The backplane according to claim 1, wherein the first reflective layer and the second reflective layer are made of a same material.

11. The backplane according to claim 1, wherein a first maximum distance exists between a surface of the light-emitting diode chip away from the bearing surface of the substrate and the bearing surface of the substrate; a second maximum distance exists between a surface of the first reflective layer away from the bearing surface of the substrate and the bearing surface of the substrate, wherein
the first maximum distance is greater than the second maximum distance; or, the first maximum distance is less than the second maximum distance.

12. The backplane according to claim 1, wherein a wall of the through hole has a protruding step, the through hole has an opening away from the substrate, and an orthogonal projection of the protruding step on the substrate is located within an orthogonal projection of the opening of the through hole on the substrate; and
a third maximum distance exists between the protruding step and the bearing surface of the substrate, and a fourth maximum distance exists between the light exit surface of the optical structure and the bearing surface of the substrate, wherein
the fourth maximum distance is greater than the third maximum distance.

13. The backplane according to claim 1, wherein
the second reflective layer is located on a side of the circuit structure layer proximate to the first reflective layer; the second reflective layer includes a plurality of hollow-out portions; the circuit structure layer includes a plurality of pads; a hollow-out portion in the plurality of hollow-out portions exposes at least one of the plurality of pads; and a single light-emitting diode chip is electrically connected to two of the plurality of pads; or
the second reflective layer is located on a side of the circuit structure layer away from the first reflective layer; the circuit structure layer has a plurality of metal wiring regions and a plurality of light-transmitting regions, a light-transmitting region being located between two adjacent metal wiring regions; the circuit structure layer includes a plurality of pads; a metal wiring region is provided with pads therein; a single light-emitting diode chip is electrically connected to two of the pads in the metal wiring region; and the light-transmitting region is configured to transmit a portion of light emitted by the light-emitting diode chip and reflected by the second reflective layer.

14. The backplane according to claim 13, wherein a gap exists between a wall of the through hole and the light-emitting diode chip, and an orthogonal projection, on the circuit structure layer, of the gap overlaps with an orthogonal projection, on the circuit structure layer, of a portion of a surface of the second reflective layer proximate to the first reflective layer; or
wherein the second reflective layer includes a first transparent insulating sub-layer, a metal reflective layer and a second transparent insulating sub-layer that are stacked in sequence in a thickness direction of the substrate.

15. The backplane according to claim 1, further comprising: an adhesive layer located between the first reflective layer and the substrate, the adhesive layer being configured to bond the first reflective layer to the substrate; or
further comprising a hydrophobic layer disposed on a side of the first reflective layer away from the substrate, wherein the hydrophobic layer includes a plurality of openings, and an orthogonal projection, on the substrate, of a through hole in the plurality of through holes is located within an orthogonal projection, on the substrate, of an opening in the plurality of openings.

16. The backplane according to claim 1, wherein materials of the optical structure include a transparent colloidal material and a fumed silica material.

17. The backplane according to claim 1, wherein materials of the optical structure include a transparent colloidal material and a light conversion material mixed in the transparent colloidal material; and the light conversion material is configured to convert a color of light emitted by the light-emitting diode chip; and/or
the backplane further comprises a light conversion layer, and the light conversion layer is located on a surface of the optical structures away from the substrate.

18. A display device, comprising:
the backplane according to claim 1, wherein
the backplane is a display substrate; or
the backplane is a backlight module, and the display device further comprises a liquid crystal display panel located on a light exit side of the backlight module.

19. A method for manufacturing a backplane, comprising:
providing a substrate, the substrate including a circuit structure layer;
forming a first reflective layer and a plurality of light-emitting diode chips on the substrate, the first reflective layer including a plurality of through holes spaced apart, a light-emitting diode chip in the plurality of light-emitting diode chips being located in one of the plurality of through holes, the plurality of light-emitting diode chips being electrically connected to the circuit structure layer, and the circuit structure layer being configured to drive the plurality of light-emitting diode chips to emit light; and
forming a plurality of optical structures on the substrate on which the plurality of light-emitting diode chips have been formed through a dispensing process, an optical structure in the plurality of optical structures covering the light-emitting diode chip in the plurality of light-emitting diode chips, a light incident surface of the optical structure being in contact with a light exit surface of light-emitting diode chip, and a light exit surface of the optical structure being a curved surface;
wherein the method further comprises:
forming a second reflective layer on the circuit structure layer, wherein the first reflective layer, the second reflective layer and the circuit structure layer are disposed in respective different layers; and the second reflective layer and the circuit structure layer are located on a same side of the first reflective layer;
wherein the first reflective layer is in contact with the second reflective layer.

20. The method for manufacturing the backplane according to claim 19, wherein
the circuit structure layer includes a plurality of pads; and
forming the first reflective layer and the plurality of light-emitting diode chips on the substrate includes:

forming a first ink film on a bearing surface of the substrate, and forming a plurality of through holes in the first ink film, so as to form the first reflective layer; and forming the plurality of light-emitting diode chips on the substrate on which the first reflective layer has been formed, each light-emitting diode chip being electrically connected to two of the plurality of pads; or the circuit structure layer includes a plurality of pads, and forming the first reflective layer and the plurality of light-emitting diode chips on the substrate includes:

forming the plurality of light-emitting diode chips on the substrate, a light-emitting diode chip in the plurality of light-emitting diode chips being electrically connected to two of the plurality of pads;

providing a reflective sheet;

forming an adhesive film on a non-functional surface of the reflective sheet;

attaching a first protective film onto the adhesive film;

forming a plurality of through holes in the reflective sheet, the adhesive film and the first protective film, each through hole penetrating the reflective sheet, the adhesive film and the first protective film, so as to obtain the first reflective layer, an adhesive layer and a first protective layer;

tearing off the first protective layer; and attaching the first reflective layer to a bearing surface of the substrate through the adhesive layer, so that the plurality of light-emitting diode chips are located in the plurality of through holes in one-to-one correspondence.

\* \* \* \* \*